US012646934B2

(12) United States Patent
Takahashi

(10) Patent No.: US 12,646,934 B2
(45) Date of Patent: Jun. 2, 2026

(54) SEMICONDUCTOR DEVICE, ELECTRONIC DEVICE, AND VEHICLE

(71) Applicant: Rohm Co., Ltd., Kyoto (JP)

(72) Inventor: Naoki Takahashi, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 271 days.

(21) Appl. No.: 18/614,483

(22) Filed: Mar. 22, 2024

(65) Prior Publication Data

US 2024/0235190 A1     Jul. 11, 2024

Related U.S. Application Data

(63) Continuation of application No. PCT/JP2022/025736, filed on Jun. 28, 2022.

(30) Foreign Application Priority Data

Sep. 27, 2021     (JP) ................................. 2021-156468

(51) Int. Cl.
*H02H 9/04*          (2006.01)
*H03K 5/00*          (2006.01)
(Continued)

(52) U.S. Cl.
CPC .............. *H02H 9/046* (2013.01); *H03K 5/00* (2013.01); *H03K 2005/00013* (2013.01);
(Continued)

(58) Field of Classification Search
CPC ..................... H02H 9/046; H03K 5/00; H03K 2005/00013; H03K 17/0822; H03K 17/08;
(Continued)

(56) References Cited

U.S. PATENT DOCUMENTS 6,038,166 A * 3/2000 Wong .................. G11C 11/5621
                                                        365/185.21
10,234,880 B1 * 3/2019 Li ........................... G05F 1/571
(Continued)

FOREIGN PATENT DOCUMENTS

WO     WO 2017/187785     11/2017

OTHER PUBLICATIONS

International Search Report and Written Opinion in International Appln. No. PCT/JP2022/025736, mailed on Oct. 4, 2022, 13 pages (with machine translation).

*Primary Examiner* — Dharti H Patel
(74) *Attorney, Agent, or Firm* — Fish & Richardson P.C.

(57) ABSTRACT

A semiconductor device includes: an output transistor of a split-gate type configured to have a plurality of channel regions controlled individually according to a plurality of gate control signals; an active clamp circuit configured to limit the terminal-to-terminal voltage across the output transistor to or below a predetermined clamp voltage after a control signal turns to a logic level requesting the output transistor to be off; a delay circuit configured to generate a delayed internal signal by giving a predetermined delay to an internal signal indicating whether the terminal-to-terminal voltage across the output transistor is higher than a predetermined threshold voltage lower than the clamp voltage; and a gate control circuit configured to control the plurality of gate control signals individually so as to raise the on resistance of the output transistor according to the delayed internal signal.

10 Claims, 21 Drawing Sheets

(51) Int. Cl.
    *H10D 30/66*        (2025.01)
    *H10D 62/10*        (2025.01)
    *H10D 64/00*        (2025.01)

(52) U.S. Cl.
    CPC ......... *H10D 30/668* (2025.01); *H10D 62/127*
                (2025.01); *H10D 64/117* (2025.01)

(58) Field of Classification Search
    CPC .. H10D 30/668; H10D 62/127; H10D 64/117;
                H10D 30/60; H02M 1/08
    USPC ........................................................ 361/91.1
    See application file for complete search history.

(56) References Cited

U.S. PATENT DOCUMENTS

2018/0048140 A1* 2/2018 Takuma ................. H02H 9/025
2019/0199227 A1* 6/2019 Radic ............... H02M 3/33592

\* cited by examiner

SEMICONDUCTOR DEVICE, ELECTRONIC DEVICE, AND VEHICLE

CROSS-REFERENCE TO RELATED APPLICATIONS

This nonprovisional application is a continuation application of International Patent Application No. PCT/JP2022/025736 filed on Jun. 28, 2022, which claims priority Japanese Patent Application No. 2021-156468 filed on Sep. 27, 2021, the entire contents of which are hereby incorporated by reference.

TECHNICAL FIELD

The disclosure herein relates to semiconductor devices, and to electronic devices and vehicles that employ semiconductor devices.

BACKGROUND ART

The present applicant has been proposing and developing a number of new technologies directed to semiconductor devices such as vehicle onboard IPDs (intelligent power devices) (see, for example, Patent Document 1 identified below).

CITATION LIST

Patent Literature

Patent Document 1: WO 2017/187785

DESCRIPTION OF EMBODIMENTS

<Semiconductor Device>

Hereinafter, various embodiments directed to semiconductor devices will be described with reference to the accompanying drawings.

Figure 1:
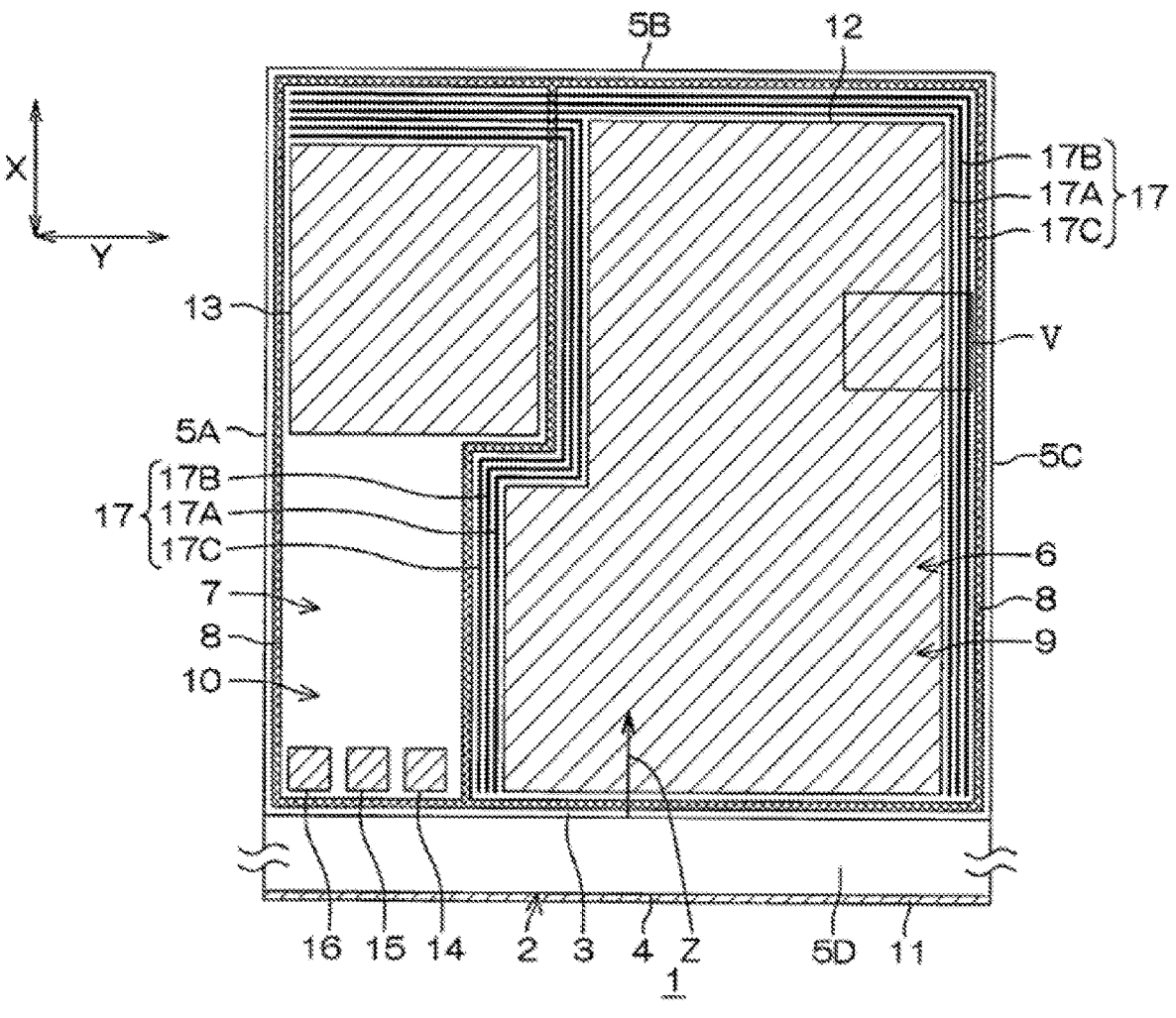
FIG. 1 is a perspective view of a semiconductor device as seen from one direction.

FIG. 1 is a perspective view of a semiconductor device 1 as seen from one direction. While the embodiments described below deal with examples where the semiconductor device 1 is a high-side switching device, this is not meant to limit the semiconductor device 1 to a high-side switching device. With appropriate adjustments made to the electrical connections or the functions of its structural parts, the semiconductor device 1 can be provided also as a low-side switching device.

Referring to FIG. 1, the semiconductor device 1 includes a semiconductor layer 2. The semiconductor layer 2 contains silicon. The semiconductor layer 2 is formed in the shape of a rectangular parallelepiped chip. The semiconductor layer 2 has a first main surface 3 on one side, a second main surface 4 on the other side, and side surfaces 5A, 5B, 5C, and 5D that connect between the first main surface 3 and the second main surface 4.

The first and second main surfaces 3 and 4 are each formed in a rectangular shape in a plan view as seen from the normal direction Z to it (hereinafter, simply referred to as "in a plan view"). The side surfaces 5A and 5C extend along a first direction X and face each other in a second direction Y which intersects the first direction X. The side surfaces 5B and 5D extend along the second direction Y and face each other in the first direction X. More specifically, the second direction Y is orthogonal to the first direction X.

In the semiconductor layer 2, an output region 6 and an input region 7 are defined. The output region 6 is defined as a region near the side surface 5C. The input region 7 is defined as a region rear the side surface 5A. In a plan view, the area SOUT of the output region 6 is equal to or larger than the area SIN of the input region 7 (SIN≤SOUT).

The ratio SOUT/SIN of the area SOUT to the area SIN can be 1 or more but 10 or less (1≤SOUT/SIN≤10). The ratio SOUT/SIN can be 1 or more but 2 or less, or 2 or more but 4 or less, or 4 or more but 6 or less, or 6 or more but 8 or less, or 8 or more but 10 or less. The input region 7 and the output region 6 can each have any planar shape, which is thus not limited to any specific shape. Needless to say, the ratio SOUT/SIN can be more than 0 but less than 1.

The output region 6 includes a power MISFET (metal-insulator-semiconductor field-effect transistor) 9 as an example of an insulated-gate power transistor. The power MISFET 9 has a gate, a drain, and a source. The power MISFET 9 functions as a high-side switch that switches between a conducting state and a cut-off state a path between a power terminal and a load.

The input region 7 includes a control IC (integrated circuit) 10 as an example of a control circuit. The control IC 10 includes a plurality of kinds of functional circuits that carry out various functions. The plurality of kinds of functional circuits include one that generates a gate control signal for driving and controlling the power MISFET 9 based on an external electrical signal. The control IC 10 along with the power MISFET 9 constitutes what is called an IPD (intelligent power device). An IPD is also called an IPM (intelligent power module).

The input region 7 is electrically insulated from the output region 6 by a region separation structure 8. In FIG. 1, the region separation structure 8 is indicated by hatching. While no specific description will be given, the region separation structure 8 can have a trench insulation structure that has an insulator embedded in a trench.

On the semiconductor layer 2, a plurality of (in this embodiment, six) electrodes 11, 12, 13, 14, 15, and 16 are formed. In FIG. 1, the plurality of electrodes 11 to 16 are indicated by hatching. The plurality of electrodes 11 to 13 are each formed as a terminal electrode to be connected to the outside via a lead wire (for example, bonding wire) or the like. There is no restriction on the number, arrangement, and planar shapes of the plurality of electrodes 11 to 16, which are thus not limited to those shown in FIG. 1.

The number, arrangement, and planar shapes of the plurality of electrodes 11 to 16 are adjusted according to the specifications of the power MISFET 9 or the specifications of the control IC 10. In this embodiment, the plurality of electrodes 11 to 16 include a drain electrode 11 (power electrode), a source electrode 12 (output electrode), an input electrode 13, a reference voltage electrode 14, an ENABLE electrode 15, and a SENSE electrode 16.

The drain electrode 11 is formed on the second main surface 4 of the semiconductor layer 2. The drain electrode 11 is electrically connected to the second main surface 4 of the semiconductor layer 2. The drain electrode 11 transmits a supply voltage VB to the drain of the power MISFET 9 and to various circuits in the control IC 10.

The drain electrode 11 can include at least one of a Ti layer, a Ni layer, a Au layer, a Ag layer, and an Al layer. The drain electrode 11 can have a single layer structure that includes a Ti layer, a Ni layer, a Au layer, a Ag layer, or an Al layer. The drain electrode 11 can have a stacked structure in which at least two of a Ti layer, a Ni layer, a Au layer, a Ag layer, and an Al layer are stacked together in any manner.

The source electrode 12 is formed on the first main surface 3, over the output region 6. The source electrode 12 is electrically connected to the source of the power MISFET 9. The source electrode 12 transmits an electrical signal generated by the power MISFET 9 to the outside.

The input electrode 13, the reference voltage electrode 14, the ENABLE electrode 15, and the SENSE electrode 16 are formed separately on the first main surface 3, over the input region 7. The input electrode 13 transmits an input voltage for driving the control IC 10.

The reference voltage electrode 14 transmits a reference voltage (e.g., ground voltage) to the control IC 10. The ENABLE electrode 15 transmits an electrical signal for enabling or disabling some or all of the functions of the control IC 10. The SENSE electrode 16 transmits an electrical signal for detecting a fault in the control IC 10.

On the semiconductor layer 2 are further formed a gate control wiring 17 as one example of a control wiring. The gate control wiring 17 is laid selectively in the output region 6 and the input region 7. The gate control wiring 17 is, in the output region 6, electrically connected to the gate of the power MISFET 9 and is, in the input region 7, electrically connected to the control IC 10.

The gate control wiring 17 transmits the gate control signal generated by the control IC 10 to the gate of the power MISFET 9. The gate control signal includes an on signal Von and an off signal Voff, and controls the on/off state of the power MISFET 9.

The ON signal Von is higher than the gate threshold voltage Vth of the power MISFET 9 (Vth≤Von). The OFF signal Voff is lower than the gate threshold voltage Vth of the power MISFET 9 (Voff<Vth). The OFF signal Voff can be the reference voltage (e.g., ground voltage).

In this embodiment, the gate control wiring 17 includes a first gate control wiring 17A, a second gate control wiring 17B, and a third gate control wiring 17C. The first, second, and third gate control wirings 17A, 17B, and 17C are electrically insulated from each other.

In this embodiment, two first gate control wirings 17A are laid in different regions, two second gate control wirings 17B are laid in different regions, and two third gate control wirings 17C are laid in different regions.

The first, second, and third gate control wirings 17A, 17B, and 17C transmit the same gate control signal or different gate control signals to the gate of the power MISFET 9. There is no restriction on the number, arrangement, shapes, etc., of the gate control wirings 17, which are adjusted according to the transmission distance of the gate control signals and/or the number of the gate control signals to be transmitted.

The source electrode 12, the input electrode 13, the reference voltage electrode 14, the ENABLE electrode 15, the SENSE electrode 16, and the gate control wiring 17 can each contain at least one of nickel, palladium, aluminum, copper, an aluminum alloy, and a copper alloy.

The source electrode 12, the input electrode 13, the reference voltage electrode 14, the ENABLE electrode 15, the SENSE electrode 16, and the gate control wiring 17 can each include at least one of an Al—Si—Cu (aluminum-silicon-copper) alloy, an Al—Si (aluminum-silicon) alloy, and an Al—Cu (aluminum-copper) alloy.

The source electrode 12, the input electrode 13, the reference voltage electrode 14, the ENABLE electrode 15, the SENSE electrode 16, and the gate control wiring 17 can include the same type of electrode material or can include mutually different electrode materials.

Figure 2:
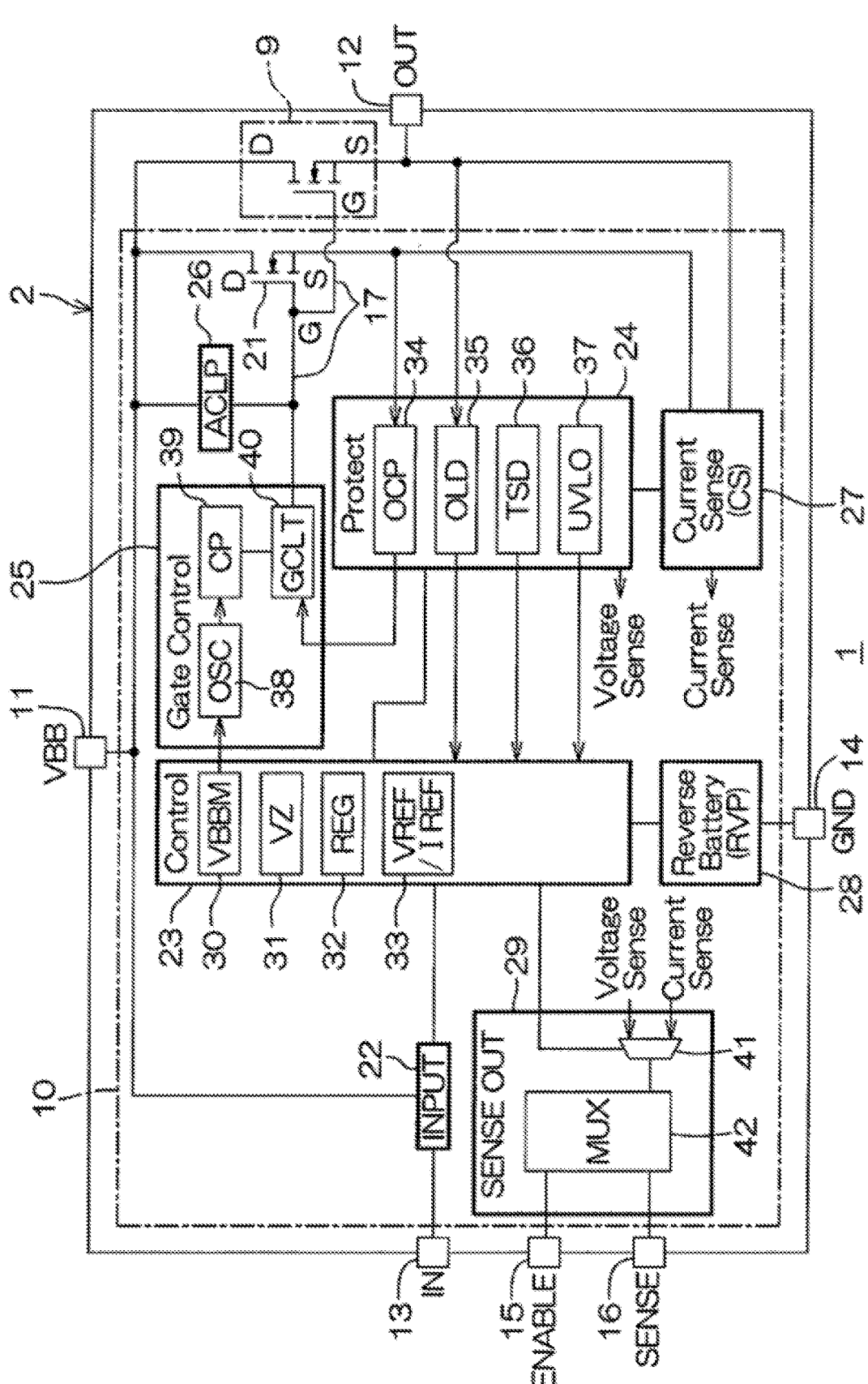
FIG. 2 is a block circuit diagram showing an electrical configuration of a semiconductor device.

FIG. 2 is a block circuit diagram showing an electrical configuration of the semiconductor device 1 shown in FIG. 1. The following description deals with an example where the semiconductor device 1 is incorporated in a vehicle.

The semiconductor device 1 includes a drain electrode 11, a source electrode 12, an input electrode 13, a reference voltage electrode 14, an ENABLE electrode 15, a SENSE electrode 16, a gate control wiring 17, a power MISFET 9, and a control IC 10.

The drain electrode 11 (i.e., a power electrode VBB) is connected to a power source. The drain electrode 11 feeds the power MISFET 9 and the control IC 10 with a supply voltage VB. The supply voltage VB can be 10 V or more but 20 V or less. On the other hand, the source electrode 12 (i.e., an output electrode OUT) is connected to a load.

The input electrode 13 (i.e., an input electrode IN) can be connected to an MCU (microcontroller unit), a DC/DC converter, a LDO (low dropout), or the like. The input electrode 13 supplies the control IC 10 with an input voltage. The input voltage can be 1 V or more but 10 V or less. The reference voltage electrode 14 is connected to a reference voltage wiring. The reference voltage electrode 14 feeds the power MISFET 9 and the control IC 10 with a reference voltage.

The ENABLE electrode 15 can be connected to the MCU. The ENABLE electrode 15 is fed with an electrical signal for enabling or disabling some or all of the functions of the control IC 10. The SENSE electrode 16 can be connected to a resistor.

The gate of the power MISFET 9 is connected via the gate control wiring 17 to the control IC 10 (a gate control circuit 25, which will be described later). The drain of the power MISFET 9 is connected to the drain electrode 11. The source of the power MISFET 9 is connected to the control IC 10 (a current sense circuit 27, which will be described later), and to the source electrode 12.

The control IC 10 includes a sensor MISFET 21, an input circuit 22, a current/voltage control circuit 23, a protection circuit 24, a gate control circuit 25, an active clamp circuit 26, a current sense circuit 27, a reversed power connection protection circuit 28, and a fault detection circuit 29.

The gate of the sensor MISFET 21 is connected to the gate control circuit 25. The drain of the sensor MISFET 21 is connected to the drain electrode 11. The source of the sensor MISFET 21 is connected to the current sense circuit 27.

The input circuit 22 is connected to the input electrode 13 and to the current/voltage control circuit 23. The input circuit 22 can include a Schmitt trigger circuit. The input circuit 22 shapes the waveform of the electrical signal fed to the input electrode 13. The signal generated by the input circuit 22 is fed to the current/voltage control circuit 23.

The current/voltage control circuit 23 is connected to the protection circuit 24, to the gate control circuit 25, to the reversed power connection protection circuit 28, and to the fault detection circuit 29. The current/voltage control circuit 23 can include a logic circuit.

The current/voltage control circuit 23 generates various voltages according to an electrical signal from the input circuit 22 and an electrical signal from the protection circuit 24. In this embodiment, the current/voltage control circuit 23 includes a driving voltage generation circuit 30, a first constant voltage generation circuit 31, a second constant voltage generation circuit 32, and a reference voltage/reference current generation circuit 33.

The driving voltage generation circuit 30 generates a driving voltage for driving the gate control circuit 25. The driving voltage can be set to a value determined by subtracting a predetermined value from the supply voltage VB. The driving voltage generation circuit 30 can generate a driving voltage of 5 V or more but 15 V or less as a voltage determined by subtracting 5 V from the supply voltage VB. The driving voltage is fed to the gate control circuit 25.

The first constant voltage generation circuit 31 generates a first constant voltage for driving the protection circuit 24. The first constant voltage generation circuit 31 can include a Zener diode or a regulator circuit (here, a Zener diode). The first constant voltage can be 1 V or more but 5 V or less. The first constant voltage is fed to the protection circuit 24 (more specifically, a load open detection circuit 35, which will be described later, or the like).

The second constant voltage generation circuit 32 generates a second constant voltage for driving the protection circuit 24. The second constant voltage generation circuit 32 can include a Zener diode or a regulator circuit (here, a regulator circuit). The second constant voltage can be 1 V or more but 5 V or less. The second constant voltage is fed to the protection circuit 24 (more specifically, an overheating protection circuit 36 and an undervoltage malfunctioning prevention circuit 37, which will be described later).

The reference voltage/reference current generation circuit 33 generates a reference voltage and a reference current for various circuits. The reference voltage can be 1 V or more but 5 V or less. The reference current can be 1 mA or more but 1 A or less. The reference voltage and the reference current are fed to various circuits. If any of the various circuits includes a comparator, the reference voltage and the reference current can be fed to the comparator.

The protection circuit 24 is connected to the current/voltage control circuit 23, to the gate control circuit 25, to the fault detection circuit 29, to the source of the power MISFET 9, and to the source of the sensor MISFET 21. The protection circuit 24 includes an overcurrent protection circuit 34, a load open detection circuit 35, an overheating protection circuit 36, and an undervoltage malfunctioning prevention circuit 37.

The overcurrent protection circuit 34 protects the power MISFET 9 from an overcurrent. The overcurrent protection circuit 34 is connected to the gate control circuit 25 and to the source of the sensor MISFET 21. The overcurrent protection circuit 34 can include a current monitor circuit. A signal generated by the overcurrent protection circuit 34 is fed to the gate control circuit 25 (more specifically, to a driving signal output circuit 40, which will be described later).

The load open detection circuit 35 detects a shorted state and an open state in the power MISFET 9. The load open detection circuit 35 is connected to the overcurrent protection circuit 34 and to the source of the power MISFET 9. A signal generated by the load open detection circuit 35 is fed to the current/voltage control circuit 23.

The overheating protection circuit 36 monitors the temperature of the power MISFET 9 and protects the power MISFET 9 from an excessive rise in temperature. The overheating protection circuit 36 is connected to the current/voltage control circuit 23. The overheating protection circuit 36 can include a temperature-sensing device such as a temperature-sensing diode or thermistor. A signal generated by the overheating protection circuit 36 is fed to the current/voltage control circuit 23.

The undervoltage malfunctioning prevention circuit 37 prevents the power MISFET 9 from malfunctioning when the supply voltage VB is less than a predetermined value. The undervoltage malfunctioning prevention circuit 37 is connected to the current/voltage control circuit 23. A signal generated by the undervoltage malfunctioning prevention circuit 37 is fed to the current/voltage control circuit 23.

The gate control circuit 25 controls the on/off state of the power MISFET 9 and the on/off state of the sensor MISFET 21. The gate control circuit 25 is connected to the current/voltage control circuit 23, to the protection circuit 24, to the gate of the power MISFET 9, and to the gate of the sensor MISFET 21.

The gate control circuit 25 generates a plurality of gate control signals corresponding to the number of gate control wirings 17 in accordance with an electrical signal from the current/voltage control circuit 23 and an electrical signal from the protection circuit 24. The plurality of gate control signals are fed via the gate control wirings 17 to the gate of the power MISFET 9 and to the gate of the sensor MISFET 21.

Specifically, the gate control circuit 25 turns on and off the power MISFET 9 by comprehensively controlling the plurality of gate control signals according to the electrical signal (input signal) fed to the input electrode 13, and also has a function of, while the active clamp circuit 26 is operating, individually controlling the plurality of gate control signals in such a way as to raise the on resistance of the power MISFET 9 (details will be given later).

More specifically, the gate control circuit 25 includes an oscillation circuit 38, a charge pump circuit 39, and a driving signal output circuit 40. The oscillation circuit 38 oscillates according to an electrical signal from the current/voltage control circuit 23 to generate a predetermined electrical signal. The electrical signal generated by the oscillation circuit 38 is fed to the charge pump circuit 39. The charge pump circuit 39 boosts the electrical signal from the oscillation circuit 38. The electrical signal boosted by the charge pump circuit 39 is fed to the driving signal output circuit 40.

The driving signal output circuit 40 generates a plurality of gate control signals according to an electrical signal from the charge pump circuit 39 and an electrical signal from the protection circuit 24 (specifically, from the overcurrent protection circuit 34). The plurality of gate control signals are fed via the gate control wirings 17 to the gate of the power MISFET 9 and to the gate of the sensor MISFET 21. The sensor MISFET 21 and the power MISFET 9 is controlled concurrently by the gate control circuit 25.

The active clamp circuit 26 protects the power MISFET 9 from a counter-electromotive force. The active clamp circuit 26 is connected to the drain electrode 11, to the gate of the power MISFET 9, and to the gate of the sensor MISFET 21. The active clamp circuit 26 can include a plurality of diodes.

The active clamp circuit 26 can include a plurality of diodes that are forward-bias-connected to each other. The active clamp circuit 26 can include a plurality of diodes reverse-bias-connected to each other. The active clamp circuit 26 can include a plurality of diodes that are forward-bias-connected to each other and a plurality of diodes that are reverse-bias-connected to each other.

The plurality of diodes can include a pn-junction diode, or a Zener diode, or a pn-junction diode and a Zener diode. The active clamp circuit 26 can include a plurality of Zener diodes that are bias-connected to each other. The active clamp circuit 26 may include a Zener diode and a pn-junction diode that are reverse-bias-connected to each other.

The current sense circuit 27 senses the currents that pass through the power MISFET 9 and the sensor MISFET 21. The current sense circuit 27 is connected to the protection circuit 24, to the fault detection circuit 29, to the source of the power MISFET 9, and to the source of the sensor MISFET 21. The current sense circuit 27 generates a current sense signal according to the electrical signal generated by the power MISFET 9 and the electrical signal generated by the sensor MISFET 21. The current sense signal is fed to the fault detection circuit 29.

The reversed power connection protection circuit 28 protects the current/voltage control circuit 23, the power MISFET 9, and the like from a reverse voltage when the power source is connected reversely. The reversed power connection protection circuit 28 is connected to the reference voltage electrode 14 and to the current/voltage control circuit 23.

The fault detection circuit 29 monitors a voltage from the protection circuit 24. The fault detection circuit 29 is connected to the current/voltage control circuit 23, to the protection circuit 24, and to the current sense circuit 27. If a fault (such as a variation in voltage) occurs in any of the overcurrent protection circuit 34, the load open detection circuit 35, the overheating protection circuit 36, and the undervoltage malfunctioning prevention circuit 37, the fault detection circuit 29 generates according to the voltage from the protection circuit 24 a fault detection signal to output it to the outside.

More specifically, the fault detection circuit 29 includes a first multiplexer circuit 41 and a second multiplexer circuit 42. The first multiplexer circuit 41 has two input ends, one output end, and one selection control end. To the input ends are connected the protection circuit 24 and the current sense circuit 27 respectively. To the output end of the first multiplexer circuit 41 is connected the second multiplexer circuit 42. To the selection control end of the first multiplexer circuit 41 is connected the current/voltage control circuit 23.s The first multiplexer circuit 41 generates a fault detection signal according to an electrical signal from the current/voltage control circuit 23, a voltage sense signal from the protection circuit 24, and a current sense signal from the current sense circuit 27. The fault detection signal generated by the first multiplexer circuit 41 is fed to the second multiplexer circuit 42.

The second multiplexer circuit 42 has two input ends and one output end. To the input ends of the second multiplexer circuit 42 are connected the output end of the second multiplexer circuit 42 and the ENABLE electrode 15 respectively. To the output end of the second multiplexer circuit 42 is connected the SENSE electrode 16.

In a case where an MCU is connected to the ENABLE electrode 15 and a resistor is connected to the SENSE electrode 16, an on signal is fed from the MCU to the ENABLE electrode 15 and a fault detection signal is extracted from the SENSE electrode 16. The fault detection signal is converted into an electrical signal by the resistor connected to the SENSE electrode 16. Based on this electrical signal, a fault in the semiconductor device 1 is detected.

Figure 3:
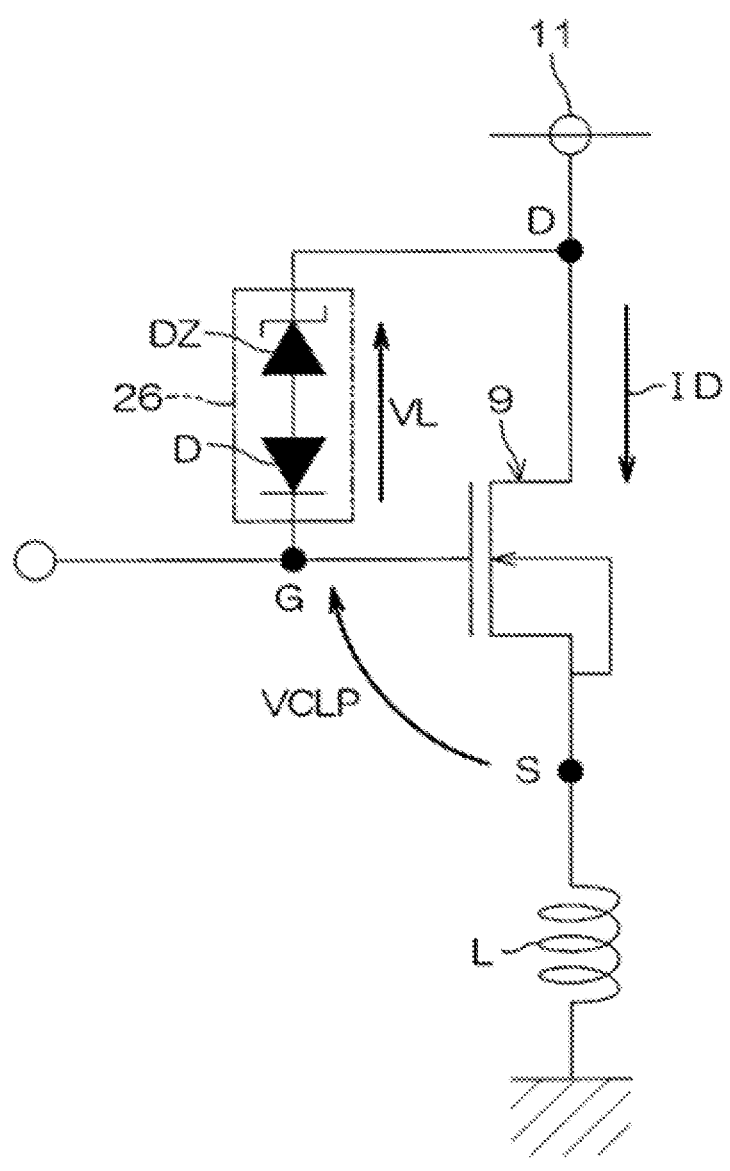
FIG. 3 is a circuit diagram illustrating normal operation and active clamp operation of a semiconductor device.
Figure 4:
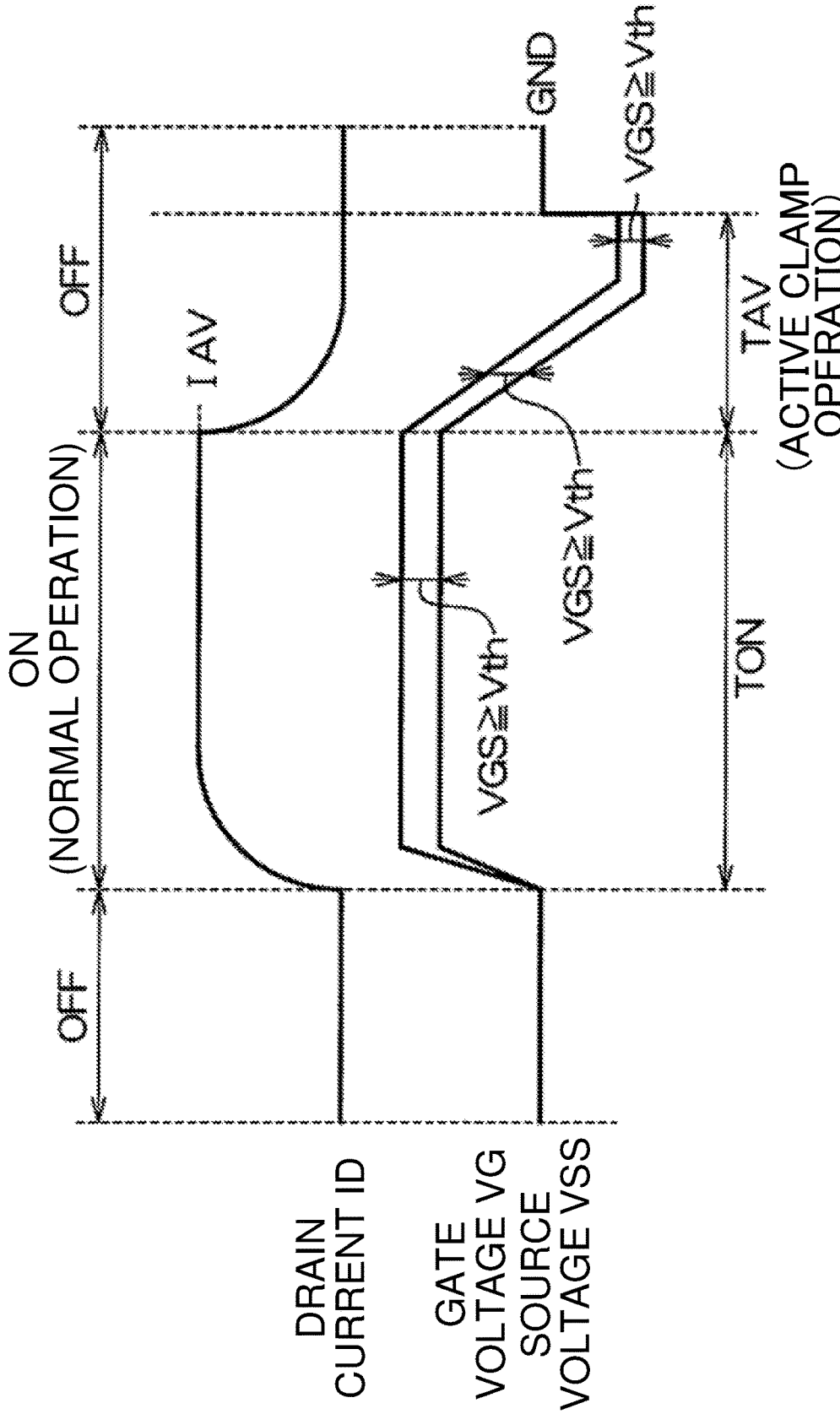
FIG. 4 is a diagram showing the waveforms of relevant electrical signals.

FIG. 3 is a circuit diagram illustrating the active clamp operation of the semiconductor device 1 shown in FIG. 1. FIG. 4 is a diagram showing the waveforms of relevant electrical signals in the circuit diagram in FIG. 3.

Here, the normal operation and the active clamp operation of the semiconductor device 1 will be described by way of a circuit example where an inductive load L is connected to the power MISFET 9. Examples of the inductive load L include devices that employ a winding (coil), such as a solenoid, a motor, a transformer, and a relay. An inductive load L is also called an L load.

Referring to FIG. 3, the source of the power MISFET 9 is connected to the inductive load L. The drain of the power MISFET 9 is electrically connected to the drain electrode 11. The gate and the drain of the power MISFET 9 are connected to the active clamp circuit 26. In this circuit example, the active clamp circuit 26 includes m Zener diodes DZ (where m is a natural number) and n pn-junction diodes D (where n is a natural number). The pn-junction diodes D are reverse-bias-connected to the Zener diodes DZ.

Referring to FIGS. 3 and 4, when an on signal Von is fed to the gate of the power MISFET 9 in the off state, the power MISFET 9 turns from off to on (normal operation). The on signal Von has a voltage equal to or more than the gate threshold voltage Vth (Vth≤Von). The power MISFET 9 is kept on for a predetermined on time TON.

When the power MISFET 9 turns on, a drain current ID stars to pass from the drain to the source of the power MISFET 9. The drain current ID increases from zero to a predetermined value and saturates. The increase in the drain current ID causes the inductive load L to accumulate inductive energy.

When an off signal Voff is fed to the gate of the power MISFET 9, the power MISFET 9 turns from on to off. The off signal Voff has a voltage less than the gate threshold voltage Vth (Voff<Vth). The off signal Voff can be a reference voltage (e.g., ground voltage).

During the transition in which the power MISFET 9 turns from on to off, the inductive energy in the inductive load L is as a counter-electromotive force applied to the power MISFET 9. This causes the power MISFET 9 to enter an active clamp state (active clamp operation). When the power MISFET 9 enters the active clamp state, its source voltage VSS falls sharply to a negative voltage less than the reference voltage (ground voltage).

Now the active clamp circuit 26 operates so as to limit the source voltage VSS to a voltage (VSS≥VB−VL−VCLP) equal to or higher than the voltage determined by subtracting a limit voltage VL and a clamp-on voltage VCLP from the supply voltage VB.

In other words, when the power MISFET 9 enters the active clamp state, the drain voltage VDS between the drain and the source of the power MISFET 9 rises sharply up to a clamp voltage VDSSCL. The clamp voltage VDSSCL is limited by the power MISFET 9 and the active clamp circuit 26 to a voltage (VDS≤VCLP+VL) equal to or lower than the voltage determined by adding up the clamp-on voltage VCLP and the limit voltage VL.

In this embodiment, the limit voltage VL is the sum (VL=m·VZ+n·VF) of the terminal-to-terminal voltage across the Zener diodes DZ and the terminal-to-terminal voltage across the pn-junction diodes.

The clamp-on voltage VCLP is the positive voltage applied between the gate and the source of the power MISFET 9 (i.e., its gate voltage VGS). The clamp-on voltage VCLP is equal to or higher than the gate threshold voltage Vth (Vth≤VCLP). Accordingly, in the active clamp state the power MISFET 9 remains on.

If the clamp voltage VDSSCL exceeds the rated maximum drain voltage VDSS (VDSS<VDSSCL), the power MISFET 9 breaks down. The power MISFET 9 is designed such that the clamp voltage VDSSCL is equal to or lower than the rated maximum drain voltage VDSS (VDSSCL≤VDSS).

If the clamp voltage VDSSCL is equal to or lower than the rated maximum drain voltage VDSS (VDSSCL≤VDSS), the drain current ID keeps passing from the drain to the source of the power MISFET 9, so that the inductive energy in the inductive load L is consumed (absorbed) in the power MISFET 9.

During the lapse of an active clamp time TAV, the drain current ID falls from its peak value IAV immediately before the turning-off of the power MISFET 9 to zero. As a result, the gate voltage VGS becomes equal to the reference voltage (e.g., ground voltage) and the power MISFET 9 turns from on to off.

The active clamp tolerance Eac of the power MISFET 9 is defined by the tolerance of the power MISFET 9 during active clamp operation. More specifically, the active clamp tolerance Eac is defined by the tolerance of the power MISFET 9 against the counter-electromotive force ascribable to the inductive energy in the inductive load L during the transition of the power MISFET 9 from on to off.

Still more specifically, the active clamp tolerance Eac is defined by the tolerance of the power MISFET 9 against the energy ascribable to the clamp voltage VDSSCL. For example, using the limit voltage VL, the clamp-on voltage VCLP, the drain current ID, and the active clamp time TAV, the active clamp tolerance Eac is given by the formula $$Eac = (VL + VCLP) \times ID \times TAV.$$

Figure 5:
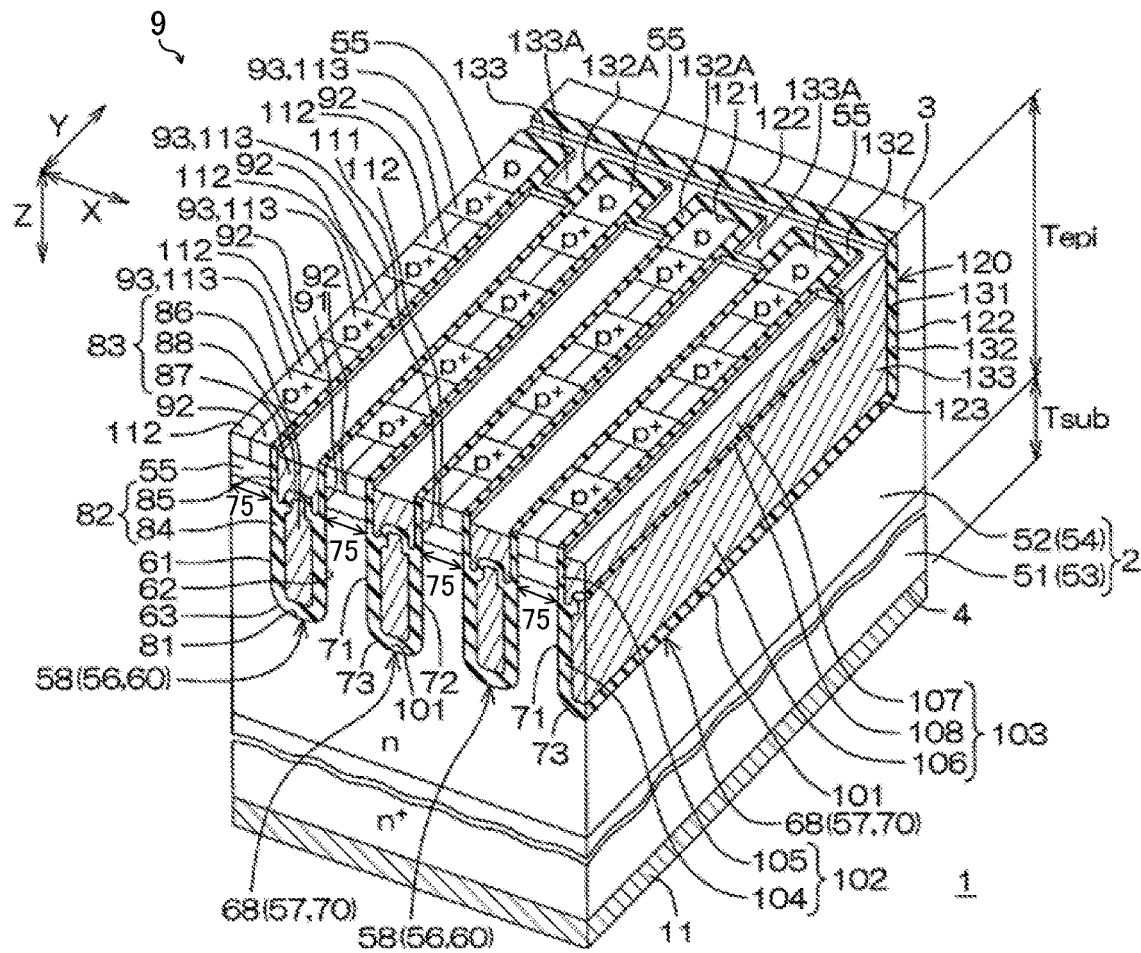
FIG. 5 is a sectional perspective view of region V in FIG. 1.

FIG. 5 is a sectional perspective view of a region V shown in FIG. 1. In the diagram, for convenience' sake, the upper structure of the first main surface 3 (such as the source electrode 12, the gate control wiring 17, and the interlayer insulation layer) are omitted from illustration.

In the semiconductor device 1 shown in FIG. 5, in this embodiment, the semiconductor layer 2 has a laminated structure including an n$^+$-type semiconductor substrate 51 and an n-type epitaxial layer 52. The second main surface 4 of the semiconductor layer 2 is formed by the semiconductor substrate 51. The first main surface 3 of the semiconductor layer 2 is formed by the epitaxial layer 52. The side surfaces 5A to 5D of the semiconductor layer 2 are formed by the semiconductor substrate 51 and the epitaxial layer 52.

The epitaxial layer 52 has an n-type impurity concentration less than an n-type impurity concentration of the semiconductor substrate 51. The n-type impurity concentration of the semiconductor substrate 51 may be from not less than $1 \times 10^{18}$ cm$^{-3}$ to not more than $1 \times 10^{20}$ cm$^{-3}$. The n-type impurity concentration of the epitaxial layer 52 may be from not less than $1 \times 10^{15}$ cm$^{-3}$ to not more than $1 \times 10^{18}$ cm$^{-3}$.

The epitaxial layer 52 has a thickness Tepi less than a thickness Tsub of the semiconductor substrate 51 (Tepi<Tsub). The thickness Tsub may be from not less than 50 μm to not more than 450 μm. The thickness Tsub may be from not less than 50 μm to not more than 150 μm, from not less than 150 μm to not more than 250 μm, from not less than 250 μm to not more than 350 μm, or from not less than 350 μm to not more than 450 μm.

By reducing the thickness Tsub, it becomes possible to reduce a resistance value. The thickness Tsub is adjusted by grinding. In this case, the second main surface 4 of the semiconductor layer 2 may be a ground surface having a grinding mark.

The thickness Tepi of the epitaxial layer 52 is preferably not more than 1/10 of the thickness Tsub. The thickness Tepi may be from not less than 5 μm to not more than 20 μm. The thickness Tepi may be from not less than 5 μm to not more than 10 μm, from not less than 10 μm to not more than 15 μm, or from not less than 15 μm to not more than 20 μm. The thickness Tepi is preferably from not less than 5 μm to not more than 15 μm.

The semiconductor substrate 51 is formed in the second main surface 4 side of the semiconductor layer 2 as a drain region 53. The epitaxial layer 52 is formed in a surface layer portion of the first main surface 3 of the semiconductor layer 2 as a drift region 54 (drain drift region). A bottom portion of the drift region 54 is formed by a boundary between the semiconductor substrate 51 and the epitaxial layer 52. Hereinafter, the epitaxial layer 52 is referred to as the drift region 54.

A p-type body region 55 is formed in a surface layer portion of the first main surface 3 of the semiconductor layer 2 in the output region 6. The body region 55 is a region which serves as a base of the power MISFET 9. A p-type impurity concentration of the body region 55 may be from not less than $1 \times 10^{16}$ cm$^{-3}$ to not more than $1 \times 10^{18}$ cm$^{-3}$.

The body region 55 is formed in a surface layer portion of the drift region 54. A bottom portion of the body region 55 is formed in a region in the first main surface 3 side with respect to the bottom portion of the drift region 54. A thickness of the body region 55 may be from not less than 0.5 μm to not more than 2 μm. The thickness of the body region 55 may be from not less than 0.5 μm to not more than 1 μm, from not less than 1 μm to not more than 1.5 μm, or from not less than 1.5 μm to not more than 2 μm.

The power MISFET 9 includes a first MISFET 56 (first transistor) and a second MISFET 57 (second transistor). The first MISFET 56 is electrically separated from the second MISFET 57 and controlled independently. The second MIS-FET 57 is electrically separated from the first MISFET 56 and controlled independently.

That is, the power MISFET 9 is configured such as to be driven when the first MISFET 56 and the second MISFET 57 are both in ON states (Full-ON control). The power MISFET 9 is also configured such as to be driven when the first MISFET 56 is in an ON state while the second MISFET 57 is in an OFF state (first Half-ON control). Further, the power MISFET 9 is configured such as to be driven when the first MISFET 56 is in an OFF state while the second MISFET 57 is in an ON state (second Half-ON control).

In the case of Full-ON control, the power MISFET 9 is driven in a state where all current paths are opened. Therefore, an ON resistance inside the semiconductor layer 2 is relatively reduced. On the other hand, in the case of first Half-ON control or second Half-ON control, the power MISFET 9 is driven in a state where some of the current paths are blocked. Therefore, the ON resistance inside the semiconductor layer 2 is relatively increased.

Specifically, the first MISFET 56 includes a plurality of first FET (Field Effect Transistor) structures 58. The plurality of first FET structures 58 are arrayed at intervals along the first direction X, and extend in a band shape along the second direction Y, respectively, in plan view. The plurality of first FET structures 58 are formed in a stripe shape as a whole in plan view.

In FIG. 5, a region of the first FET structure 58 at one end portion side is shown, while a region of the first FET structure 58 at the other end portion side is omitted. The region of the first FET structure 58 at the other end portion side is substantially similar in structure to the region of the first FET structure 58 at one end portion side. Hereinafter, the structure of the region of the first FET structure 58 at one end portion side is described as an example, and a description of the structure of the region of the first FET structure 58 at the other end portion side shall be omitted.

In this embodiment, each of the first FET structures 58 includes a first trench gate structure 60. A first width WT1 of the first trench gate structure 60 may be from not less than 0.5 μm to not more than 5 μm. The first width WT1 is a width in a direction (first direction X) orthogonal to a direction (second direction Y) in which the first trench gate structure 60 extends.

The first width WT1 may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The first width WT1 is preferably from not less than 0.8 μm to not more than 1.2 μm.

The first trench gate structure 60 penetrates through the body region 55 and reaches the drift region 54. A first depth DT1 of the first trench gate structure 60 may be from not less than 1 μm to not more than 10 μm. The first depth DT1 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The first depth DT1 is preferably from not less than 2 μm to not more than 6 μm.

The first trench gate structure 60 includes a first side wall 61 on one side, a second side wall 62 on the other side, and a bottom wall 63 which connects the first side wall 61 and the second side wall 62. Hereinafter, the first side wall 61, the second side wall 62, and the bottom wall 63 may be collectively referred to as "an inner wall" or "an outer wall."

An absolute value of an angle (taper angel) formed between the first side wall 61 and the first main surface 3 inside the semiconductor layer 2 may be in excess of 90° and not more than 95° (for example, approximately 91°). The absolute value of an angle (taper angel) formed between the second side wall 62 and the first main surface 3 inside the semiconductor layer 2 may be in excess of 90° and not more than 95° (for example, approximately 91°). The first trench gate structure 60 may be formed in a shape (tapered shape) that the first width WT1 is made narrow from the first main surface 3 side to the bottom wall 63 side in sectional view.

The bottom wall 63 of the first trench gate structure 60 is positioned in a region at the first main surface 3 side with respect to the bottom portion of the drift region 54. The bottom wall 63 of the first trench gate structure 60 is formed in a convex curved shape (U letter shape) toward the bottom portion of the drift region 54.

The bottom wall 63 of the first trench gate structure 60 is positioned in a region at the first main surface 3 side with a first interval IT1 of not less than 1 μm to not more than 10 μm from the bottom portion of the drift region 54. The first interval IT1 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The first interval IT1 is preferably from not less than 1 μm to not more than 5 μm.

In this embodiment, the second MISFET 57 includes a plurality of second FET structures 68. The plurality of second FET structures 68 are arrayed at intervals along the first direction X, and extend in a band shape along the second direction Y, respectively, in plan view.

The plurality of second FET structures 68 extend along the same direction as the plurality of first FET structures 58. The plurality of second FET structures 68 are formed in a stripe shape as a whole in plan view. In this embodiment, the plurality of second FET structures 68 are arrayed alternately with the plurality of first FET structures 58 in a manner that one first FET structure 58 is held therebetween.

In FIG. 5, a region of the second FET structure 68 at one end portion side is shown in the drawing, while a region of the second FET structure 68 at the other end portion side is omitted. The region of the second FET structure 68 at the other end portion side is substantially similar in structure to the region of the second FET structure 68 t one end portion side. Hereinafter, the structure of the region of the second FET structure 68 at one end portion side is described as an example, and a description of the structure of the region of the second FET structure 68 at the other end portion side shall be omitted.

In this embodiment, each of the second FET structures 68 includes a second trench gate structure 70. A second width WT2 of the second trench gate structure 70 may be from not less than 0.5 μm to not more than 5 μm. The second width WT2 is a width in a direction (first direction X) orthogonal to a direction (second direction Y) in which the second trench gate structure 70 extends.

The second width WT2 may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The second width WT2 is preferably from not less than 0.8 μm to not more than 1.2 μm.

The second width WT2 of the second trench gate structure 70 may be equal to or more than the first width WT1 of the first trench gate structure 60 (WT1≤WT2). The second width WT2 may be equal to or less than the first width WT1 (WT1≥WT2). It is preferable that the second width WT2 is equal to the first width WT1 (WT1=WT2).

The second trench gate structure 70 penetrates through the body region 55 and reaches the drift region 54. A second depth DT2 of the second trench gate structure 70 may be from not less than 1 μm to not more than 10 μm. The second depth DT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second depth DT2 is preferably from not less than 2 μm to not more than 6 μm.

The second depth DT2 of the second trench gate structure 70 may be equal to or more than the first depth DT1 of the first trench gate structure 60 (DT1≤DT2). The second depth DT2 may be equal to or less than the first depth DT1 (DT1≥DT2). It is preferable that the second depth DT2 is equal to the first depth DT1 (DT1=DT2).

The second trench gate structure 70 includes a first side wall 71 on one side, a second side wall 72 on the other side, and a bottom wall 73 which connects the first side wall 71 and the second side wall 72. Hereinafter, the first side wall 71, the second side wall 72, and the bottom wall 73 may be collectively referred to as "an inner wall" or "an outer wall."

An absolute value of an angle (taper angel) formed between the first side wall 71 and the first main surface 3 inside the semiconductor layer 2 may be in excess of 90° and not more than 95° (for example, approximately 91°). The absolute value of an angle (taper angel) formed between the second side wall 72 and the first main surface 3 inside the semiconductor layer 2 may be in excess of 90° and not more than 95° (for example, approximately 91°). The second trench gate structure 70 may be formed in a shape (tapered shape) that the second width WT2 is made narrow from the first main surface 3 side to the bottom wall 73 side in sectional view.

The bottom wall 73 of the second trench gate structure 70 is positioned in a region at the first main surface 3 side with respect to the bottom portion of the drift region 54. The bottom wall 73 of the second trench gate structure 70 is formed in a convex curved shape (U letter shape) toward the bottom portion of the drift region 54.

The bottom wall 73 of the second trench gate structure 70 is positioned in a region at the first main surface 3 side with a second interval IT2 of not less than 1 μm to not more than 10 μm from the bottom portion of the drift region 54. The second interval IT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second interval IT2 is preferably from not less than 1 μm to not more than 5 μm.

Cell regions 75 are each defined in regions between the plurality of first trench gate structures 60 and the plurality of second trench gate structures 70. The plurality of cell regions 75 are arrayed at intervals along the first direction X, and extend in a band shape along the second direction Y, respectively, in plan view. The plurality of cell regions 75 extend along the same direction as the first trench gate structure 60 and the second trench gate structure 70. The plurality of cell regions 75 are formed in a stripe shape as a whole in plan view.

A first depletion layer spreads inside the drift region 54 from an outer wall of the first trench gate structure 60. The first depletion layer spreads toward a direction along the first main surface 3 from the outer wall of the first trench gate structure 60 and toward the normal direction Z. Similarly, a second depletion layer spreads inside the drift region 54 from the outer wall of the second trench gate structure 70. The second depletion layer spreads toward a direction along the first main surface 3 from the outer wall of the second trench gate structure 70 and toward the normal direction Z.

The second trench gate structure 70 is arrayed at an interval from the first trench gate structure 60 in a manner that the second depletion layer overlaps with the first depletion layer. That is, the second depletion layer overlaps with the first depletion layer in a region at the first main surface 3 side with respect to the bottom wall 73 of the second trench gate structure 70 in the cell region 75. According to the above described structure, since it is possible to suppress an electric field concentration on the first trench gate structure 60 and the second trench gate structure 70, it is possible to suppress a reduction in breakdown voltage.

It is preferable that the second depletion layer overlaps with the first depletion layer in a region at the bottom portion side of the drift region 54 with respect to the bottom wall 73 of the second trench gate structure 70. According to the above described structure, since it is possible to suppress an electric field concentration in the bottom wall 63 of the first trench gate structure 60 and the bottom wall 73 of the second trench gate structure 70, it is possible to appropriately suppress a reduction in breakdown voltage.

A pitch PS between a side wall of the first trench gate structure 60 and that of the second trench gate structure 70 may be from not less than 0.2 μm to not more than 2 μm. The pitch PS is a distance in a direction (first direction X) orthogonal to a direction (second direction Y) in which the first trench gate structure 60 and the second trench gate structure 70 extend between the first side wall 61 (second side wall 62) of the first trench gate structure 60 and the second side wall 72 (first side wall 71) of the second trench gate structure 70.

The pitch PS may be from not less than 0.2 μm to not more than 0.4 μm, from not less than 0.4 μm to not more than 0.6 μm, from not less than 0.6 μm to not more than 0.8 μm, from not less than 0.8 μm to not more than 1.0 μm, from not less than 1.0 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2.0 μm. The pitch PS is preferably from not less than 0.3 μm to not more than 1.5 μm.

A pitch PC between a central portion of the first trench gate structure 60 and that of the second trench gate structure 70 may be from not less than 1 μm to not more than 7 μm. The pitch PC is a distance in a direction (the first direction X) orthogonal to a direction (the second direction Y) in which the first trench gate structure 60 and the second trench gate structure 70 extend between the central portion of the first trench gate structure 60 and the central portion of the second trench gate structure 70.

The pitch PC may be from not less than 1 μm to not more than 2 μm, from not less than 2 μm to not more than 3 μm, from not less than 3 μm to not more than 4 μm, from not less than 4 μm to not more than 5 μm, from not less than 5 μm to not more than 6 μm, or from not less than 6 μm to not more than 7 μm. The pitch PC is preferably from not less than 1 μm to not more than 3 μm.

More specifically, the first trench gate structure 60 includes a first gate trench 81, a first insulation layer 82, and a first electrode 83. The first gate trench 81 is formed by digging down the first main surface 3 toward the second main surface 4 side.

The first gate trench 81 defines the first side wall 61, the second side wall 62, and the bottom wall 63 of the first trench gate structure 60. Hereinafter, the first side wall 61, the second side wall 62, and the bottom wall 63 of the first trench gate structure 60 shall also be referred to as the first side wall 61, the second side wall 62, and the bottom wall 63 of the first gate trench 81.

The first insulation layer 82 is formed in a film shape along an inner wall of the first gate trench 81. The first insulation layer 82 defines a concave space inside the first gate trench 81. A portion which covers the bottom wall 63 of the first gate trench 81 in the first insulation layer 82 is conformally formed along the bottom wall 63 of the first gate trench 81. Thereby, the first insulation layer 82 defines a U letter space which is recessed in a U letter shape inside the first gate trench 81.

The first insulation layer 82 includes at least any one of silicon oxide ($SiO_2$), silicon nitride ($SiN$), aluminum oxide ($Al_2O_3$), zirconium oxide ($ZrO_2$), and tantalum oxide ($Ta_2O_3$).

The first insulation layer 82 may have a laminated structure including an SiN layer and an $SiO_2$ layer formed in that order from the semiconductor layer 2 side. The first insulation layer 82 may have a laminated structure including an $SiO_2$ layer and an SiN layer formed in that order from the semiconductor layer 2 side. The first insulation layer 82 has a single layer structure composed of an $SiO_2$ layer or an SiN layer. In this embodiment, the first insulation layer 82 has a single layer structure composed of an $SiO_2$ layer.

The first insulation layer 82 includes a first bottom-side insulation layer 84 and a first opening-side insulation layer 85 which are formed in this order from the bottom wall 63 side of the first gate trench 81 to the first main surface 3 side.

The first bottom-side insulation layer 84 covers the inner wall of the first gate trench 81 at the bottom wall 63 side. More specifically, the first bottom-side insulation layer 84 covers the inner wall of the first gate trench 81 at the bottom wall 63 side with respect to the bottom portion of the body region 55. The first bottom-side insulation layer 84 defines a U letter space at the bottom wall 63 side of the first gate trench 81. The first bottom-side insulation layer 84 has a smooth inner wall surface which defines the U letter space. The first bottom-side insulation layer 84 is in contact with the drift region 54. A part of the first bottom-side insulation layer 84 may be in contact with the body region 55.

The first opening-side insulation layer 85 covers the inner wall of the first gate trench 81 at the opening side. More specifically, the first opening-side insulation layer 85 covers the first side wall 61 and the second side wall 62 of the first gate trench 81 in a region at the opening side of the first gate trench 81 with respect to the bottom portion of the body region 55. The first opening-side insulation layer 85 is in contact with the body region 55. A part of the first opening-side insulation layer 85 may be in contact with the drift region 54.

The first bottom-side insulation layer 84 has a first thickness T1. The first opening-side insulation layer 85 has a second thickness T2 less than the first thickness T1 (T2<T1). The first thickness T1 is a thickness of the first bottom-side insulation layer 84 along a normal direction of the inner wall of the first gate trench 81. The second thickness T2 is a thickness of the first opening-side insulation layer 85 along the normal direction of the inner wall of the first gate trench 81.

A first ratio T1/WT1 of the first thickness T1 with respect to the first width WT1 of the first gate trench 81 may be from not less than 0.1 to not more than 0.4. Instead, the first ratio T1/WT1 may be from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The first ratio T1/WT1 is preferably from not less than 0.25 to not more than 0.35.

The first thickness T1 of the first bottom-side insulation layer 84 may be from not less than 1500 Å to not more than 4000 Å. The first thickness T1 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The first thickness T1 is preferably from not less than 1800 Å to not more than 3500 Å.

The first thickness T1 may be adjusted to a range from not less than 4000 Å to not more than 12000 Å according to the first width WT1 of the first gate trench 81. The first thickness T1 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the first bottom-side insulation layer 84, it becomes possible to increase a withstand voltage of the semiconductor device 1.

The second thickness T2 of the first opening-side insulation layer 85 may be from not less than 1/100 to not more than 1/10 of the first thickness T1 of the first bottom-side insulation layer 84. The second thickness T2 may be from not less than 100 Å to not more than 500 Å. The second thickness T2 may be from not less than 100 Å to not more than 200 Å, from not less than 200 Å to not more than 300 Å, from not less than 300 Å to not more than 400 Å, or from not less than 400 Å to not more than 500 Å. The second thickness T2 is preferably from not less than 200 Å to not more than 400 Å.

The first bottom-side insulation layer 84 is formed in a manner that the first thickness T1 is reduced from a part which covers the first side wall 61 and the second side wall 62 of the first gate trench 81 toward a part which covers the bottom wall 63 of the first gate trench 81.

The part which covers the bottom wall 63 of the first gate trench 81 in the first bottom-side insulation layer 84 is smaller in thickness than the part which covers the first side wall 61 and the second side wall 62 of the first gate trench 81 in the first bottom-side insulation layer 84. An opening width of the U letter space in the bottom wall side defined by the first bottom-side insulation layer 84 is expanded by an amount of a reduction in the first thickness T1. Thereby, the U letter space is suppressed from being tapered. The above-described U letter space is formed, for example, by an etching method (for example, a wet etching method) to the inner wall of the first bottom-side insulation layer 84.

The first electrode 83 is embedded in the first gate trench 81 across the first insulation layer 82. First gate control signals (first control signals) including an ON signal Von and an OFF signal Voff are applied to the first electrode 83. In this embodiment, the first electrode 83 has an insulated separation type split electrode structure including a first bottom-side electrode 86, a first opening-side electrode 87, and a first intermediate insulation layer 88.

The first bottom-side electrode 86 is embedded in the bottom wall 63 side of the first gate trench 81 across the first insulation layer 82. More specifically, the first bottom-side electrode 86 is embedded in the bottom wall 63 side of the first gate trench 81 across the first bottom-side insulation layer 84. The first bottom-side electrode 86 faces the drift region 54 across the first bottom-side insulation layer 84. A part of the first bottom-side electrode 86 may face the body region 55 across the first bottom-side insulation layer 84.

The first bottom-side electrode 86 defines an inverted concave recess in sectional view between the first bottom-side insulation layer 84 and the first opening-side insulation layer 85 at the opening side of the first gate trench 81. According to the above-described structure, since it is possible to suppress a local electric field concentration on the first bottom-side electrode 86, it is possible to suppress a reduction in breakdown voltage. In particular, by embedding the first bottom-side electrode 86 into an expanded U letter space of the first bottom-side insulation layer 84, it becomes possible to appropriately suppress the first bottom-side electrode 86 from being tapered from the upper end portion to the lower end portion. Thereby, it is possible to appropriately suppress a local electric field concentration on the lower end portion of the first bottom-side electrode 86.

The first bottom-side electrode 86 may include at least any one of conductive polysilicon, tungsten, aluminum, copper, an aluminum alloy, and a copper alloy. In this embodiment, the first bottom-side electrode 86 includes conductive polysilicon. The conductive polysilicon may include an n-type impurity or a p-type impurity. The conductive polysilicon preferably includes an n-type impurity.

The first opening-side electrode 87 is embedded into the opening side of the first gate trench 81 across the first insulation layer 82. More specifically, the first opening-side electrode 87 is embedded in the inverted concave recess defined at the opening side of the first gate trench 81 across the first opening-side insulation layer 85. The first opening-side electrode 87 faces the body region 55 across the first opening-side insulation layer 85. A part of the first opening-side electrode 87 may face the drift region 54 across the first opening-side insulation layer 85.

The first opening-side electrode 87 may include at least any one of conductive polysilicon, tungsten, aluminum, copper, an aluminum alloy, and a copper alloy. The first opening-side electrode 87 preferably includes the same type of conductive material as the first bottom-side electrode 86. In this embodiment, the first opening-side electrode 87 includes conductive polysilicon. The conductive polysilicon may include an n-type impurity or a p-type impurity. The conductive polysilicon preferably includes an n-type impurity.

The first intermediate insulation layer 88 is interposed between the first bottom-side electrode 86 and the first opening-side electrode 87 to electrically insulate the first bottom-side electrode 86 and the first opening-side electrode 87. More specifically, the first intermediate insulation layer 88 covers the first bottom-side electrode 86 exposed from the first bottom-side insulation layer 84 in a region between the first bottom-side electrode 86 and the first opening-side electrode 87. The first intermediate insulation layer 88 covers the upper end portion (more specifically, protruded portion) of the first bottom-side electrode 86. The first intermediate insulation layer 88 is continuous with the first insulation layer 82 (first bottom-side insulation layer 84).

The first intermediate insulation layer 88 has a third thickness T3. The third thickness T3 is less than the first thickness T1 of the first bottom-side insulation layer 84 (T3<T1). The third thickness T3 may be from not less than $\frac{1}{100}$ to not more than $\frac{1}{10}$ of the thickness T1. The third thickness T3 may be from not less than 100 Å to not more than 500 Å. The third thickness T3 may be from not less than 100 Å to not more than 200 Å, from not less than 200 Å to not more than 300 Å, from not less than 300 Å to not more than 400 Å, or from not less than 400 Å to not more than 500 Å. The third thickness T3 is preferably from not less than 200 Å to not more than 400 Å.

The first intermediate insulation layer 88 includes at least any one of silicon oxide ($SiO_2$), silicon nitride (SiN), aluminum oxide ($Al_2O_3$), zirconium oxide ($ZrO_2$), and tantalum oxide ($Ta_2O_3$). In this embodiment, the first intermediate insulation layer 88 has a single layer structure composed of an $SiO_2$ layer.

In this embodiment, an exposed portion which is exposed from the first gate trench 81 in the first opening-side electrode 87 is positioned at the bottom wall 63 side of the first gate trench 81 with respect to the first main surface 3. The exposed portion of the first opening-side electrode 87 is formed in a curved shape toward the bottom wall 63 of the first gate trench 81.

The exposed portion of the first opening-side electrode 87 is covered by a first cap insulation layer formed in a film shape. The first cap insulation layer is continuous with the first insulation layer 82 (first opening-side insulation layer 85) inside the first gate trench 81. The first cap insulation layer may include silicon oxide ($SiO_2$).

Each of the first FET structures 58 further includes a p-type first channel region 91 (first channel). The first channel region 91 is formed in a region which faces the first electrode 83 (first opening-side electrode 87) across the first insulation layer 82 (first opening-side insulation layer 85) in the body region 55.

The first channel region 91 is formed along the first side wall 61 or the second side wall 62 of the first trench gate structure 60, or along the first side wall 61 and the second side wall 62 thereof. In this embodiment, the first channel region 91 is formed along the first side wall 61 and the second side wall 62 of the first trench gate structure 60.

Each of the first FET structure 58 further includes an n⁺-type first source region 92 formed in a surface layer portion of the body region 55. The first source region 92 demarcates the first channel region 91 with the drift region 54 inside the body region 55. An n-type impurity concentration of the first source region 92 is in excess of an n-type impurity concentration of the drift region 54. The n-type impurity concentration of the first source region 92 may be from not less than $1\times10^{19}$ cm$^{-3}$ to not more than $1\times10^{21}$ cm$^{-3}$.

In this embodiment, each of the first FET structures 58 includes the plurality of first source regions 92. The plurality of first source regions 92 are formed in the surface layer portion of the body region 55 at an interval along the first trench gate structure 60. More specifically, the plurality of first source regions 92 are formed along the first side wall 61 or the second side wall 62 of the first trench gate structure 60, or along the first side wall 61 and the second side wall 62 thereof. In this embodiment, the plurality of first source regions 92 are formed at an interval along the first side wall 61 and the second side wall 62 of the first trench gate structure 60.

The bottom portions of the plurality of first source regions 92 are positioned in a region at the first main surface 3 side with respect to the bottom portion of the body region 55. Thereby, the plurality of first source regions 92 face the first electrode 83 (first opening-side electrode 87) across the first insulation layer 82 (first opening-side insulation layer 85). Thus, the first channel region 91 of the first MISFET 56 is formed in a region which is held between the plurality of first source regions 92 and the drift region 54 in the body region 55.

Each of the first FET structures 58 further includes a p$^+$-type first contact region 93 formed in the surface layer portion of the body region 55. A p-type impurity concentration of the first contact region 93 is in excess of a p-type impurity concentration of the body region 55. The p-type impurity concentration of the first contact region 93 may be, for example, from not less than $1\times10^{19}$ cm$^{-3}$ to not more than $1\times10^{21}$ cm$^{-3}$.

In this embodiment, each of the first FET structure 58 includes a plurality of first contact regions 93. The plurality of first contact regions 93 are formed in the surface layer portion of the body region 55 at an interval along the first trench gate structure 60. More specifically, the plurality of first contact regions 93 are formed along the first side wall 61 or the second side wall 62 of the first trench gate structure 60, or along the first side wall 61 and the second side wall 62 thereof.

In this embodiment, the plurality of first contact regions 93 are formed at an interval along the first side wall 61 and the second side wall 62 of the first trench gate structure 60. More specifically, the plurality of first contact regions 93 are formed in the surface layer portion of the body region 55 in a manner that the plurality of first contact regions 93 are alternately arrayed with the plurality of first source regions 92. The bottom portions of the plurality of first contact regions 93 are positioned in a region at the first main surface 3 side with respect to the bottom portion of the body region 55.

The second trench gate structure 70 includes a second gate trench 101, a second insulation layer 102, and a second electrode 103. The second gate trench 101 is formed by digging down the first main surface 3 toward the second main surface 4 side.

The second gate trench 101 defines the first side wall 71, the second side wall 72, and the bottom wall 73 of the second trench gate structure 70. Hereinafter, the first side wall 71, the second side wall 72, and the bottom wall 73 of the second trench gate structure 70 are also referred to as the first side wall 71, the second side wall 72, and the bottom wall 73 of the second gate trench 101.

The second insulation layer 102 is formed in a film shape along an inner wall of the second gate trench 101. The second insulation layer 102 defines a concave space inside the second gate trench 101. A part which covers the bottom wall 73 of the second gate trench 101 in the second insulation layer 102 is conformally formed along the bottom wall 73 of the second gate trench 101. Thereby, the second insulation layer 102 defines a U letter space recessed in a U letter shape inside the second gate trench 101.

The second insulation layer 102 includes at least any one of silicon oxide (SiO$_2$), silicon nitride (SiN), aluminum oxide (Al$_2$O$_3$), zirconium oxide (ZrO$_2$), and tantalum oxide (Ta$_2$O$_3$).

The second insulation layer 102 may have a laminated structure including an SiN layer and an SiO$_2$ layer formed in that order from the semiconductor layer 2 side. The second insulation layer 102 may have a laminated structure including an SiO$_2$ layer and an SiN layer formed in that order from the semiconductor layer 2 side. The second insulation layer 102 has a single layer structure composed of an SiO$_2$ layer or an SiN layer. In this embodiment, the second insulation layer 102 has a single layer structure composed of an SiO$_2$ layer.

The second insulation layer 102 includes a second bottom-side insulation layer 104 and a second opening-side insulation layer 105 which are formed in this order from the bottom wall 73 side of the second gate trench 101 to the first main surface 3 side.

The second bottom-side insulation layer 104 covers the inner wall of the second gate trench 101 at the bottom wall 73 side. More specifically, the second bottom-side insulation layer 104 covers the inner wall of the second gate trench 101 at the bottom wall 73 side with respect to the bottom portion of the body region 55. The second bottom-side insulation layer 104 defines a U letter space at the bottom wall 73 side of the second gate trench 101. The second bottom-side insulation layer 104 has a smooth inner wall surface which defines the U letter space. The second bottom-side insulation layer 104 is in contact with the drift region 54. A part of the second bottom-side insulation layer 104 may be in contact with the body region 55.

The second opening-side insulation layer 105 covers the inner wall of the second gate trench 101 at the opening side. More specifically, the second opening-side insulation layer 105 covers the first side wall 71 and the second side wall 72 of the second gate trench 101 in a region of the second gate trench 101 at the opening side with respect to the bottom portion of the body region 55. The second opening-side insulation layer 105 is in contact with the body region 55. A part of the second opening-side insulation layer 105 may be in contact with the drift region 54.

The second bottom-side insulation layer 104 has a fourth thickness T4. The second opening-side insulation layer 105 has a fifth thickness T5 less than the fourth thickness T4 (T5<T4). The fourth thickness T4 is a thickness of the second bottom-side insulation layer 104 along a normal direction of the inner wall of the second gate trench 101. The fifth thickness T5 is a thickness of the second opening-side insulation layer 105 along the normal direction of the inner wall of the second gate trench 101.

A second ratio T4/WT2 of the fourth thickness T4 with respect to the second width WT2 of the second gate trench 101, may be from not less than 0.1 to not more than 0.4. The second ratio T4/WT2 may be, for example, from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The second ratio T4/WT2 is preferably from not less than 0.25 to not more than 0.35.

The second ratio T4/WT2 may be equal to or less than the first ratio T1/WT1 (T4/WT2≤T1/WT1). The second ratio T4/WT2 may be equal to or more than the first ratio T1/WT1 (T4/WT2>T1/WT1). Instead, the second ratio T4/WT2 may be equal to the first ratio T1/WT1 (T4/WT2=T1/WT1).

The fourth thickness T4 of the second bottom-side insulation layer 104 may be from not less than 1500 Å to not more than 4000 Å. The fourth thickness T4 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The fourth thickness T4 is preferably from not less than 1800 Å to not more than 3500 Å.

The fourth thickness T4 may be from not less than 4000 Å to not more than 12000 Å according to the second width WT2 of the second gate trench 101. The fourth thickness T4 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the second bottom-side insulation layer 104, it becomes possible to increase a withstand voltage of the semiconductor device 1.

The fourth thickness T4 may be equal to or less than the first thickness T1 (T4≤T1). The fourth thickness T4 may be equal to or more than the first thickness T1 (T4≥T1). The fourth thickness T4 may be equal to the first thickness T1 (T4=T1).

The fifth thickness T5 of the second opening-side insulation layer 105 is less than the fourth thickness T4 of the second bottom-side insulation layer 104 (T5<T4). The fifth thickness T5 may be from not less than $\frac{1}{100}$ of the fourth thickness T4 to not more than $\frac{1}{10}$. The fifth thickness T5 may be from not less than 100 Å to not more than 500 Å. The fifth thickness T5 may be from not less than 100 Å to not more than 200 Å, from not less than 200 Å to not more than 300 Å, from not less than 300 Å to not more than 400 Å, or from not less than 400 Å to not more than 500 Å. The fifth thickness T5 is preferably from not less than 200 Å to not more than 400 Å.

The fifth thickness T5 may be equal to or less than the second thickness T2 (T5≤T2). The fifth thickness T5 may be equal to or more than the second thickness T2 (T5>T2). The fifth thickness T5 may be equal to the second thickness T2 (T5=T2).

The second bottom-side insulation layer 104 is formed in a manner that the fourth thickness T4 is reduced from a part which covers the first side wall 71 and the second side wall 72 of the second gate trench 101 toward a part which covers the bottom wall 73 of the second gate trench 101.

The part which covers the bottom wall 73 of the second gate trench 101 in the second bottom-side insulation layer 104 is smaller in thickness than the part which covers the first side wall 71 and the second side wall 72 of the second gate trench 101 in the second bottom-side insulation layer 104. An opening width of the U letter space defined by the second bottom-side insulation layer 104 at the bottom wall side is expanded by an amount of a reduction in the fourth thickness T4. Thereby, the U letter space is suppressed from being tapered. The above-described U letter space is formed, for example, by an etching method (for example, a wet etching method) to the inner wall of the second bottom-side insulation layer 104.

The second electrode 103 is embedded in the second gate trench 101 across the second insulation layer 102. Second gate control signals (second control signals) including an ON signal Von and an OFF signal Voff are applied to the second electrode 103.

In this embodiment, the second electrode 103 has an insulated-separation type split electrode structure including a second bottom-side electrode 106, a second opening-side electrode 107, and a second intermediate insulation layer 108. In this embodiment, the second bottom-side electrode 106 is electrically connected to the first bottom-side electrode 86. The second opening-side electrode 107 is electrically insulated from the first opening-side electrode 87.

The second bottom-side electrode 106 is embedded in the bottom wall 73 side of the second gate trench 101 across the second insulation layer 102. More specifically, the second bottom-side electrode 106 is embedded in the bottom wall 73 side of the second gate trench 101 across the second bottom-side insulation layer 104. The second bottom-side electrode 106 faces the drift region 54 across the second bottom-side insulation layer 104. A part of the second bottom-side electrode 106 may face the body region 55 across the second bottom-side insulation layer 104.

The second bottom-side electrode 106 defines an inverted concave recess in sectional view between the second bottom-side insulation layer 104 and the second opening-side insulation layer 105 at the opening side of the second gate trench 101. According to the above-described structure, since it is possible to suppress a local electric field concentration on the second bottom-side electrode 106, it is possible to suppress a reduction in breakdown voltage. In particular, by embedding the second bottom-side electrode 106 into the U letter space expanded by the second bottom-side insulation layer 104, it becomes possible to appropriately suppress the second bottom-side electrode 106 from being tapered from the upper end portion to the lower end portion. Thereby, it is possible to appropriately suppress a local electric field concentration at the lower end portion of the second bottom-side electrode 106.

The second bottom-side electrode 106 may include at least any one of conductive polysilicon, tungsten, aluminum, copper, an aluminum alloy, and a copper alloy. In this embodiment, the second bottom-side electrode 106 includes conductive polysilicon. The conductive polysilicon may include an n-type impurity or a p-type impurity. The conductive polysilicon preferably includes an n-type impurity.

The second opening-side electrode 107 is embedded in the opening side of the second gate trench 101 across the second insulation layer 102. More specifically, the second opening-side electrode 107 is embedded in the inverted concave recess defined at the opening side of the second gate trench 101 across the second opening-side insulation layer 105. The second opening-side electrode 107 faces the body region 55 across the second opening-side insulation layer 105. A part of the second opening-side electrode 107 may face the drift region 54 across the second opening-side insulation layer 105.

The second opening-side electrode 107 may include at least any one of conductive polysilicon, tungsten, aluminum, copper, an aluminum alloy, and a copper alloy. The second opening-side electrode 107 preferably includes the same type of conductive material as the second bottom-side electrode 106. In this embodiment, the second opening-side electrode 107 includes conductive polysilicon. The conductive polysilicon may include an n-type impurity or a p-type impurity. The conductive polysilicon preferably includes an n-type impurity.

The second intermediate insulation layer 108 is interposed between the second bottom-side electrode 106 and the second opening-side electrode 107 to electrically insulate the second bottom-side electrode 106 and the second opening-side electrode 107. More specifically, the second intermediate insulation layer 108 covers the second bottom-side electrode 106 exposed from the second bottom-side insulation layer 104 in a region between the second bottom-side electrode 106 and the second opening-side electrode 107. The second intermediate insulation layer 108 covers the upper end portion of the second bottom-side electrode 106 (more specifically, a protruded portion). The second intermediate insulation layer 108 is continuous with the second insulation layer 102 (second bottom-side insulation layer 104).

The second intermediate insulation layer 108 has a sixth thickness T6. The sixth thickness T6 is less than the fourth thickness T4 of the second bottom-side insulation layer 104 (T6<T4). The sixth thickness T6 may be from not less than $\frac{1}{100}$ of the fourth thickness T4 to not more than $\frac{1}{10}$. The sixth thickness T6 may be from not less than 100 Å to not more than 500 Å. The sixth thickness T6 may be from not less than 100 Å to not more than 200 Å, from not less than 200 Å to not more than 300 Å, from not less than 300 Å to not more than 400 Å, or from not less than 400 Å to not more than 500 Å. The sixth thickness T6 is preferably from not less than 200 Å to not more than 400 Å.

The sixth thickness T6 may be equal to or less than the third thickness T3 (T6≤T3). The sixth thickness T6 may be equal to or more than the third thickness T3 (T6≥T3). The sixth thickness T6 may be equal to the third thickness T3 (T6=T3).

The second intermediate insulation layer 108 includes at least any one of silicon oxide ($SiO_2$), silicon nitride (SiN), aluminum oxide ($Al_2O_3$), zirconium oxide ($ZrO_2$), and tantalum oxide ($Ta_2O_3$). In this embodiment, the second intermediate insulation layer 108 has a single layer structure composed of an $SiO_2$ layer.

In this embodiment, an exposed portion which is exposed from the second gate trench 101 in the second opening-side electrode 107 is positioned at the bottom wall 73 side of the second gate trench 101 with respect to the first main surface 3. The exposed portion of the second opening-side electrode 107 is formed in a curved shape toward the bottom wall 73 of the second gate trench 101.

The exposed portion of the second opening-side electrode 107 is covered by a second cap insulation layer formed in a film shape. The second cap insulation layer is continuous with the second insulation layer 102 (second opening-side insulation layer 105) inside the second gate trench 101. The second cap insulation layer may include silicon oxide ($SiO_2$).

Each of the second FET structures 68 further includes a p-type second channel region 111 (second channel). More specifically, the second channel region 111 is formed in a region which faces the second electrode 103 (second opening-side electrode 107) across the second insulation layer 102 (second opening-side insulation layer 105) in the body region 55.

More specifically, the second channel region 111 is formed along the first side wall 71 or the second side wall 72 of the second trench gate structure 70, or along the first side wall 71 and the second side wall 72 thereof. In this embodiment, the second channel region 111 is formed along the first side wall 71 and the second side wall 72 of the second trench gate structure 70.

Each of the second FET structures 68 further includes an $n^+$-type second source region 112 formed in the surface layer portion of the body region 55. The second source region 112 demarcates the second channel region 111 with the drift region 54 inside the body region 55.

An n-type impurity concentration of the second source region 112 is in excess of an n-type impurity concentration of the drift region 54. The n-type impurity concentration of the second source region 112 may be from not less than $1×10^{19}$ cm$^{-3}$ to not more than $1×10^{21}$ cm$^{-3}$. It is preferable that the n-type impurity concentration of the second source region 112 is equal to the n-type impurity concentration of the first source region 92.

In this embodiment, each of the second FET structures 68 includes the plurality of second source regions 112. The plurality of second source regions 112 are formed in the surface layer portion of the body region 55 at an interval along the second trench gate structure 70. Specifically, the plurality of second source regions 112 are formed along the first side wall 71 or the second side wall 72 of the second trench gate structure 70, or along the first side wall 71 and the second side wall 72 thereof. In this embodiment, the plurality of second source regions 112 are formed at an interval along the first side wall 71 and the second side wall 72 of the second trench gate structure 70.

In this embodiment, each of the second source regions 112 faces each of the first source regions 92 along the first direction X. Each of the second source regions 112 is integrally formed with each of the first source regions 92. FIG. 5 shows that the first source region 92 and the second source region 112 are distinguished from each other by a boundary line. However, in actuality, there is no clear boundary line in a region between the first source region 92 and the second source region 112.

The second source regions 112 may be each formed such as to be shifted from each of the first source regions 92 in the second direction Y such as not to face some of or all of the first source regions 92 along the first direction X. That is, the plurality of first source regions 92 and the plurality of second source regions 112 may be arrayed in a staggered manner in plan view.

The bottom portions of the plurality of second source regions 112 are positioned in a region at the first main surface 3 side with respect to the bottom portion of the body region 55. Thereby, the plurality of second source regions 112 face the second electrode 103 (second opening-side electrode 107) across the second insulation layer 102 (second opening-side insulation layer 105). Thus, the second channel region 111 of the second MISFET 57 is formed in a region held between the plurality of second source regions 112 and the drift region 54 in the body region 55.

Each of the second FET structures 68 further includes a $p^+$-type second contact region 113 formed in the surface layer portion of the body region 55. A p-type impurity concentration of the second contact region 113 is in excess of a p-type impurity concentration of the body region 55. The p-type impurity concentration of the second contact region 113 may be from not less than $1×10^{19}$ cm$^{-3}$ to not more than $1×10^{21}$ cm$^{-3}$. It is preferable that the p-type impurity concentration of the second contact region 113 is equal to the p-type impurity concentration of the first contact region 93.

In this embodiment, each of the second FET structures 68 includes the plurality of second contact regions 113. The plurality of second contact regions 113 are formed in the surface layer portion of the body region 55 at an interval along the second trench gate structure 70. More specifically, the plurality of second contact regions 113 are formed along the first side wall 71 or the second side wall 72 of the second trench gate structure 70, or along the first side wall 71 and the second side wall 72 thereof. The bottom portions of the plurality of second contact regions 113 are positioned in a region in the first main surface 3 side with respect to the bottom portion of the body region 55.

In this embodiment, the plurality of second contact regions 113 are formed at an interval along the first side wall 71 and the second side wall 72 of the second trench gate structure 70. More specifically, the plurality of second contact regions 113 are formed in the surface layer portion of the body region 55 in a manner that the plurality of second contact regions 113 are arrayed alternately with the plurality of second source regions 112.

With reference to FIG. 5, in this embodiment, each of the second contact regions 113 faces each of the first contact regions 93 along the first direction X. Each of the second contact regions 113 is integrally formed with each of the first contact regions 93.

In FIG. 5, in order to distinguish the first contact region 93 and the second contact region 113 from the first source region 92 and the second source region 112, the first contact region 93 and the second contact region 113 are collectively indicated by a reference sign of "p$^+$."

Each of the second contact regions 113 may be formed such as to be shifted from each of the first contact regions 93 in the second direction Y such as not to face some of or all of the first contact regions 93 along the first direction X. That is, the plurality of first contact regions 93 and the plurality of second contact regions 113 may be arrayed in a staggered manner in plan view.

With reference to FIG. 5, in this embodiment, the body region 55 is exposed from a region between one end portion of the first trench gate structure 60 and one end portion of the second trench gate structure 70 in the first main surface 3 of the semiconductor layer 2. Any of the first source region 92, the first contact region 93, the second source region 112, and the second contact region 113 is not formed in the region held between one end portion of the first trench gate structure 60 and one end portion of the second trench gate structure 70 in the first main surface 3.

Similarly, although not shown in the drawings, in this embodiment, the body region 55 is exposed from a region between the other end portion of the first trench gate structure 60 and the other end portion of the second trench gate structure 70 in the first main surface 3 of the semiconductor layer 2. Any of the first source region 92, the first contact region 93, the second source region 112, and the second contact region 113 is not formed in the region held between the other end portion of the first trench gate structure 60 and the other end portion of the second trench gate structure 70.

With reference to FIG. 5, a plurality of (Here, two) trench contact structures 120 are formed in the first main surface 3 of the semiconductor layer 2. The plurality of trench contact structures 120 include a trench contact structure 120 at one side and a trench contact structure 120 at the other side.

The trench contact structure 120 at one side is positioned in a region at the side of one end portion of the first trench gate structure 60 and one end portion of the second trench gate structure 70. The trench contact structure 120 at the other side is positioned in a region at the side of the other end portion of the first trench gate structure 60 and at the other end portion of the second trench gate structure 70.

The trench contact structure 120 at the other side is substantially similar in structure to the trench contact structure 120 at one side. Hereinafter, a structure of the trench contact structure 120 at one side shall be described as an example, and a specific description of a structure of the trench contact structure 120 at the other side shall be omitted.

The trench contact structure 120 is connected to one end portion of the first trench gate structure 60 and one end portion of the second trench gate structure 70. In this embodiment, the trench contact structure 120 extends in a band shape along the first direction X in plan view.

A width WTC of the trench contact structure 120 may be from not less than 0.5 μm to not more than 5 μm. The width WTC is a width in a direction (second direction Y) orthogonal to a direction (first direction X) in which the trench contact structure 120 extends.

The width WTC may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The width WTC is preferably from not less than 0.8 μm to not more than 1.2 μm.

It is preferable that the width WTC is equal to the first width WT1 of the first trench gate structure 60 (WTC=WT1). It is preferable that the width WTC is equal to the second width WT2 of the second trench gate structure 70 (WTC=WT2).

The trench contact structure 120 penetrates through the body region 55 and reaches the drift region 54. A depth DTC of the trench contact structure 120 may be from not less than 1 μm to not more than 10 μm. The depth DTC may be from may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The depth DTC is preferably from not less than 2 μm to not more than 6 μm.

It is preferable that the depth DTC is equal to the first depth DT1 of the first trench gate structure 60 (DTC=DT1). It is preferable that the depth DTC is equal to the second depth DT2 of the second trench gate structure 70 (DTC=DT2).

The trench contact structure 120 includes a first side wall 121 on one side, a second side wall 122 on the other side, and a bottom wall 123 which connects the first side wall 121 and the second side wall 122. Hereinafter, the first side wall 121, the second side wall 122, and the bottom wall 123 may be collectively referred to as "an inner wall." The first side wall 121 is a connection surface which is connected to the first trench gate structure 60 and the second trench gate structure 70.

The first side wall 121, the second side wall 122, and the bottom wall 123 are positioned inside the drift region 54. The first side wall 121 and the second side wall 122 extend along the normal direction Z. The first side wall 121 and the second side wall 122 may be formed perpendicularly to the first main surface 3.

An absolute value of an angle (taper angel) formed between the first side wall 121 and the first main surface 3 inside semiconductor layer 2 may be in excess of 90° and not more than 95° (for example, approximately 91°). The absolute value of an angle (taper angel) formed between the second side wall 122 and the first main surface 3 inside the semiconductor layer 2 may be in excess of 90° and not more than 95° (for example, approximately 91°). The trench contact structure 120 may be formed in a shape (tapered shape) that the width WTC is made narrow from the first main surface 3 side of the semiconductor layer 2 to the bottom wall 123 side in sectional view.

The bottom wall 123 is positioned in a region at the first main surface 3 side with respect to the bottom portion of the drift region 54. The bottom wall 123 is formed in a convex curved shape toward the bottom portion of the drift region 54. The bottom wall 123 is positioned in a region at the first main surface 3 side with an interval ITC of not less than 1 μm to not more than 10 μm from the bottom portion of the drift region 54. The interval ITC may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The interval ITC is preferably from not less than 1 μm to not more than 5 μm.

It is preferable that the interval ITC is equal to the first interval IT1 of the first trench gate structure 60 (ITC=IT1). It is preferable that the interval ITC is equal to the second interval IT2 of the second trench gate structure 70 (ITC=IT2).

The trench contact structure 120 includes a contact trench 131, a contact insulation layer 132, and a contact electrode 133. The contact trench 131 is formed by digging down the first main surface 3 of the semiconductor layer 2 toward the second main surface 4 side.

The contact trench 131 defines the first side wall 121, the second side wall 122, and the bottom wall 123 of the trench contact structure 120. Hereinafter, the first side wall 121, the second side wall 122, and the bottom wall 123 of the trench contact structure 120 are also referred to as the first side wall 121, the second side wall 122, and the bottom wall 123 of the contact trench 131.

The first side wall 121 of the contact trench 131 communicates with the first side wall 61 and the second side wall 62 of the first gate trench 81. The first side wall 121 of the contact trench 131 communicates with the first side wall 71 and the second side wall 72 of the second gate trench 101. The contact trench 131 forms one trench with the first gate trench 81 and the second gate trench 101.

The contact insulation layer 132 is formed in a film shape along an inner wall of the contact trench 131. The contact insulation layer 132 defines a concave space inside the contact trench 131. A part which covers the bottom wall 123 of the contact trench 131 in the contact insulation layer 132 is conformally formed along the bottom wall 123 of the contact trench 131.

The contact insulation layer 132 defines a U letter space recessed in a U letter shape inside the contact trench 131 in a manner similar to the first bottom-side insulation layer 84 (second bottom-side insulation layer 104). That is, the contact insulation layer 132 defines a U letter space in which a region of the contact trench 131 at the bottom wall 123 side is expanded and suppressed from being tapered. The above-described U letter space is formed, for example, by an etching method (for example, a wet etching method) to the inner wall of the contact insulation layer 132.

The contact insulation layer 132 has a seventh thickness T7. The seventh thickness T7 may be from not less than 1500 Å to not more than 4000 Å. The seventh thickness T7 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The seventh thickness T7 is preferably from not less than 1800 Å to not more than 3500 Å.

The seventh thickness T7 may be from not less than 4000 Å to not more than 12000 Å according to the width WTC of the trench contact structure 120. The seventh thickness T7 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the contact insulation layer 132, it becomes possible to increase a withstand voltage of the semiconductor device 1.

It is preferable that the seventh thickness T7 is equal to the first thickness T1 of the first bottom-side insulation layer 84 (T7=T1). It is preferable that the seventh thickness T7 is equal to the fourth thickness T4 of the second bottom-side insulation layer 104 (T7=T4).

The contact insulation layer 132 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The contact insulation layer 132 may have a laminated structure including an SiN layer and an $SiO_2$ layer formed in that order from the semiconductor layer 2 side. The contact insulation layer 132 may have a laminated structure including an $SiO_2$ layer and an SiN layer formed in that order from the semiconductor layer 2 side. The contact insulation layer 132 has a single layer structure composed of an $SiO_2$ layer or an SiN layer. In this embodiment, the contact insulation layer 132 has a single layer structure composed of an $SiO_2$ layer. The contact insulation layer 132 is preferably composed of the same insulating material as the first insulation layer 82 (second insulation layer 102).

The contact insulation layer 132 is integrally formed with the first insulation layer 82 in a communication portion between the first gate trench 81 and the contact trench 131. The contact insulation layer 132 is integrally formed with the second insulation layer 102 in a communication portion between the second gate trench 101 and the contact trench 131.

In this embodiment, the contact insulation layer 132 has a lead-out insulation layer 132A which is led out to one end portion of the first gate trench 81 and one end portion of the second gate trench 101. The lead-out insulation layer 132A crosses the communication portion to cover an inner wall of one end portion of the first gate trench 81. The lead-out insulation layer 132A crosses the communication portion to cover an inner wall of one end portion of the second gate trench 101.

The lead-out insulation layer 132A is integrally formed with the first bottom-side insulation layer 84 and the first opening-side insulation layer 85 inside the first gate trench 81. The lead-out insulation layer 132A defines a U letter space together with the first bottom-side insulation layer 84 at the inner wall of one end portion of the first gate trench 81.

The lead-out insulation layer 132A is integrally formed with the second bottom-side insulation layer 104 and the second opening-side insulation layer 105 inside the second gate trench 101. The lead-out insulation layer 132A defines the U letter space together with the second bottom-side insulation layer 104 at the inner wall of one end portion of the second gate trench 101.

The contact electrode 133 is embedded in the contact trench 131 across the contact insulation layer 132. The contact electrode 133 is embedded in the contact trench 131 as an integrated member unlike the first electrode 83 and the second electrode 103. The contact electrode 133 has an upper end portion exposed from the contact trench 131 and a lower end portion in contact with the contact insulation layer 132.

The lower end portion of the contact electrode 133 is formed in a convex curved shape toward the bottom wall 123 of the contact trench 131 in a manner similar to the first bottom-side electrode 86 (second bottom-side electrode 106). More specifically, the lower end portion of the contact electrode 133 is conformally formed along the bottom wall of the U letter space defined by the contact insulation layer 132 and formed in a smooth convex curved shape toward the bottom wall 123.

According to the above-described structure, since it is possible to suppress a local electric field concentration on the contact electrode 133, it is possible to suppress a reduction in breakdown voltage. In particular, by embedding the contact electrode 133 into the expanded U letter space of the contact insulation layer 132, it becomes possible to appropriately suppress the contact electrode 133 from being tapered from the upper end portion to the lower end portion. Thereby, it is possible to appropriately suppress a local electric field concentration on the lower end portion of the contact insulation layer 132.

The contact electrode 133 is electrically connected to the first bottom-side electrode 86 at the connection portion between the first gate trench 81 and the contact trench 131. The contact electrode 133 is electrically connected to the second bottom-side electrode 106 at the connection portion between the second gate trench 101 and the contact trench 131. Thereby, the second bottom-side electrode 106 is electrically connected to the first bottom-side electrode 86.

More specifically, the contact electrode 133 has a lead-out electrode 133A which is led out to one end portion of the first gate trench 81 and one end portion of the second gate trench 101. The lead-out electrode 133A crosses the communication portion between the first gate trench 81 and the contact trench 131 and is positioned inside the first gate trench 81. The lead-out electrode 133A also crosses the communication portion between the second gate trench 101 and the contact trench 131 and is positioned inside the second gate trench 101.

The lead-out electrode 133A is embedded in a U letter space defined by the contact insulation layer 132 inside the first gate trench 81. The lead-out electrode 133A is integrally formed with the first bottom-side electrode 86 inside the first gate trench 81. Thereby, the contact electrode 133 is electrically connected to the first bottom-side electrode 86.

The first intermediate insulation layer 88 is interposed between the contact electrode 133 and the first opening-side electrode 87 inside the first gate trench 81. Thereby, the contact electrode 133 is electrically insulated from the first opening-side electrode 87 inside the first gate trench 81.

The lead-out electrode 133A is embedded in the U letter space defined by the contact insulation layer 132 inside the second gate trench 101. The lead-out electrode 133A is integrally formed with the second bottom-side electrode 106 inside the second gate trench 101. Thereby, the contact electrode 133 is electrically connected to the second bottom-side electrode 106.

The second intermediate insulation layer 108 is interposed between the contact electrode 133 and the second opening-side electrode 107 inside the second gate trench 101. Thereby, the contact electrode 133 is electrically insulated from the second opening-side electrode 107 inside the second gate trench 101.

The contact electrode 133 may include at least any one of conductive polysilicon, tungsten, aluminum, copper, an aluminum alloy, and a copper alloy. In this embodiment, the contact electrode 133 may include conductive polysilicon. The conductive polysilicon may include an n-type impurity or a p-type impurity. The conductive polysilicon preferably includes an n-type impurity. It is preferable that the contact electrode 133 includes the same conductive material as the first bottom-side electrode 86 and the second bottom-side electrode 106.

In this embodiment, an exposed portion which is exposed from the contact trench 131 in the contact electrode 133 is positioned at the bottom wall 123 side of the contact trench 131 with respect to the first main surface 3. The exposed portion of the contact electrode 133 is formed in a curved shape toward the bottom wall 123 of the contact trench 131.

The exposed portion of the contact electrode 133 is covered by a third cap insulation layer 139 which is formed in a film shape. The third cap insulation layer 139 is continuous with the contact insulation layer 132 inside the contact trench 131. The third cap insulation layer 139 may include silicon oxide ($SiO_2$).

The gate control signal input from the control IC 10 to the first gate control wiring 17A (not shown) is transmitted to the first opening-side electrode 87. The gate control signal input from the control IC 10 to the second gate control wiring 17B (not shown) is transmitted to the second opening-side electrode 107. The gate control signal input from the control IC 10 to the third gate control wiring 17C (not shown) is transmitted to the first bottom-side electrode 86 and the second bottom-side electrode 106 through the contact electrode 133.

In a case where the first MISFET 56 (first trench gate structure 60) and the second MISFET 57 (second trench gate structure 70) are both controlled to be in the OFF states, the first channel region 91 and the second channel region 111 are both controlled to be in the OFF states.

In a case where the first MISFET 56 and the second MISFET 57 are both controlled to be in the ON states, the first channel region 91 and the second channel region 111 are both controlled to be in the ON states (Full-ON control).

In a case where the first MISFET 56 is controlled to be in the ON state while the second MISFET 57 is controlled to be in the OFF state, the first channel region 91 is controlled to be in the ON state and the second channel region 111 is controlled to be in the OFF state (first Half-ON control).

In a case where the first MISFET 56 is controlled to be in the OFF state while the second MISFET 57 is controlled to be in the ON state, the first channel region 91 is controlled to be in the OFF state and the second channel region 111 is controlled to be in the ON state (second Half-ON control).

As described above, in the power MISFET 9, the first MISFET 56 and the second MISFET 57 formed in one output region 6 are used to realize plural types of control including Full-ON control, first Half-ON control, and second Half-ON control.

When the first MISFET 56 is driven (that is, when the gate is controlled to be in the ON state), the ON signal Von may be applied to the first bottom-side electrode 86 and the ON signal Von may be applied to the first opening-side electrode 87. In this case, the first bottom-side electrode 86 and the first opening-side electrode 87 each function as a gate electrode.

Thereby, it is possible to suppress a voltage drop between the first bottom-side electrode 86 and the first opening-side electrode 87 and therefore it is possible to suppress an electric field concentration between the first bottom-side electrode 86 and the first opening-side electrode 87. It is also possible to reduce an ON resistance of the semiconductor layer 2 and therefore it is thereby possible to reduce electricity consumption.

When the first MISFET 56 is driven (that is, when the gate is controlled to be in the ON state), the OFF signal Voff (for example, the reference voltage) may be applied to the first bottom-side electrode 86 and the ON signal Von may be applied to the first opening-side electrode 87. In this case, while the first bottom-side electrode 86 functions as a field electrode, the first opening-side electrode 87 functions as a gate electrode. Thereby, it is possible to reduce a parasitic capacitance and therefore it is possible to improve a switching speed.

When the second MISFET 57 is driven (that is, when the gate is controlled to be in the ON state), the ON signal Von may be applied to the second bottom-side electrode 106 and the ON signal Von may be applied to the second opening-side electrode 107. In this case, the second bottom-side electrode 106 and the second opening-side electrode 107 each function as a gate electrode.

Thereby, it is possible to suppress a voltage drop between the second bottom-side electrode 106 and the second opening-side electrode 107 and therefore it is possible to suppress an electric field concentration between the second bottom-side electrode 106 and the second opening-side electrode 107. It is also possible to reduce an ON resistance of the semiconductor layer 2 and therefore it is possible to reduce electricity consumption.

When the second MISFET 57 is driven (that is, when the gate is controlled to be in the ON state), the OFF signal Voff (reference voltage) may be applied to the second bottom-side electrode 106 and the ON signal Von may be applied to the second opening-side electrode 107. In this case, while the second bottom-side electrode 106 functions as a field electrode, the second opening-side electrode 107 functions as a gate electrode. Thereby, it is possible to reduce a parasitic capacitance and therefore it is possible to improve a switching speed.

With reference to FIG. 5, the first channel region 91 is formed in each of the cell regions 75 at a first channel area S1. The first channel area S1 is defined by a total planar area of the plurality of first source regions 92 formed in each of the cell regions 75.

The first channel region 91 is formed in each of the cell regions 75 at a first channel rate R1 (first rate) (with a first channel ratio R1 (first ratio)). The first channel rate R1 is a rate which is occupied by the first channel area S1 in each of the cell regions 75 when a planar area of each cell region 75 is given as 100%.

The first channel rate R1 is adjusted to a range from not less than 0% to not more than 50%. The first channel rate R1 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The first channel rate R1 is preferably from not less than 10% to not more than 35%.

In a case where the first channel rate R1 is 50%, the first source region 92 is formed in a substantially entire region of the first side wall 61 and the second side wall 62 of the first trench gate structure 60. In this case, no first contact region 93 is formed at the first side wall 61 side or the second side wall 62 side of the first trench gate structure 60. The first channel rate R1 is preferably less than 50%.

In a case where the first channel rate R1 is 0%, no first source region 92 is formed in the first side wall 61 side or the second side wall 62 side of the first trench gate structure 60. In this case, only the body region 55 and/or the first contact region 93 are formed in the first side wall 61 side and the second side wall 62 side of the first trench gate structure 60. The first channel rate R1 is preferably in excess of 0%. In this embodiment, an example in which the first channel rate R1 is 25% is shown.

The second channel region 111 is formed in each of the cell regions 75 at a second channel area S2. The second channel area S2 is defined by a total planar area of the plurality of second source regions 112 formed in each of the cell regions 75.

The second channel region 111 is formed in each of the cell regions 75 at a second channel rate R2 (second rate) (with a second channel ratio R2 (second ratio)). The second channel rate R2 is a rate which is occupied by the second channel area S2 in each of the cell regions 75 when a planar area of each of the cell regions 75 is given as 100%.

The second channel rate R2 is adjusted to a range from not less than 0% to not more than 50%. The second channel rate R2 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The second channel rate R2 is preferably from not less than 10% to not more than 35%.

In a case where the second channel rate R2 is 50%, the second source region 112 is formed in a substantially entire region of the first side wall 71 side and the second side wall 72 side of the second trench gate structure 70. In this case, no second contact region 113 is formed in the first side wall 71 side or the second side wall 72 side of the second trench gate structure 70. The second channel rate R2 is preferably less than 50%.

In a case where the second channel rate R2 is 0%, no second source region 112 is formed in the first side wall 71 side or the second side wall 72 side of the second trench gate structure 70. In this case, only the body region 55 and/or the second contact region 113 are formed in the first side wall 71 side and the second side wall 72 side of the second trench gate structure 70. The second channel rate R2 is preferably in excess of 0%. In this embodiment, an example in which the second channel rate R2 is 25% is shown.

As described above, the first channel region 91 and the second channel region 111 are formed in each of the cell regions 75 at a total channel rate RT (RT=R1+R2) from not less than 0% to not more than 100% (preferably in excess of 0% to less than 100%).

In this embodiment, the total channel rate RT in each of the cell regions 75 is 50%. In this embodiment, the total channel rates RT are all set at an equal value. Thus, an average channel rate RAV inside the output region 6 (unit area) is given as 50%. The average channel rate RAV is such that a sum of all of the total channel rates RT is divided by a total number of the total channel rates RT.

Incidentally, the total channel rate RT may be adjusted for each cell region 75. That is, the plurality of total channel rates RT different in value from each other may be each applied to each of the cell regions 75. The total channel rate RT relates to a temperature rise of the semiconductor layer 2. For example, an increase in the total channel rate RT causes a temperature rise of the semiconductor layer 2 to occur easily. On the other hand, a reduction in the total channel rate RT causes a temperature rise of the semiconductor layer 2 not to occur easily.

By using the above, the total channel rate RT may be adjusted according to a temperature distribution of the semiconductor layer 2. For example, the total channel rate RT of a region in which a temperature rise easily occurs in the semiconductor layer 2 may be made relatively small, and the total channel rate RT of a region in which a temperature rise does not easily occur in the semiconductor layer 2 may be made relatively large.

A central portion of the output region 6 can be given as an example of a region in which a temperature rise easily occurs in the semiconductor layer 2. A peripheral portion of the output region 6 can be given as an example of a region in which a temperature rise does not easily occur in the semiconductor layer 2. As a matter of course, the average channel rate RAV may be adjusted while the total channel rate RT is adjusted according to a temperature distribution of the semiconductor layer 2.

The plurality of cell regions 75 having the total channel rate RT of not less than 20% to not more than 40% (for example, 25%) may be concentrated at a region in which a temperature rise easily occurs (for example, a central portion). The plurality of cell regions 75 having the total channel rate RT of not less than 60% to not more than 80% (for example, 75%) may be concentrated at a region in which a temperature rise does not easily occur (for example, a peripheral portion). The plurality of cell regions 75 having the total channel rate RT in excess of 40% and less than 60% (for example, 50%) may be concentrated between a region in which a temperature rise easily occurs and a region in which a temperature rise does not easily occur.

Further, the total channel rate RT of not less than 20% to not more than 40%, the total channel rate RT of not less than 40% to not more than 60%, and the total channel rate RT of not less than 60% to not more than 80% may be applied to the plurality of cell regions 75 in a regular arrangement.

As an example, three types of total channel rates RT which sequentially repeat in a pattern of 25% (low)→50% (middle)→75% (high) may be applied to the plurality of cell regions 75. In this case, the average channel rate RAV may be adjusted to 50%. In the case of the above-described structure, it is possible to suppress, with a relatively simple design, a biased temperature distribution in the semiconductor layer 2 to be formed. A specific configuration to which the above structure is applied is shown in the next embodiment.

Figure 6:
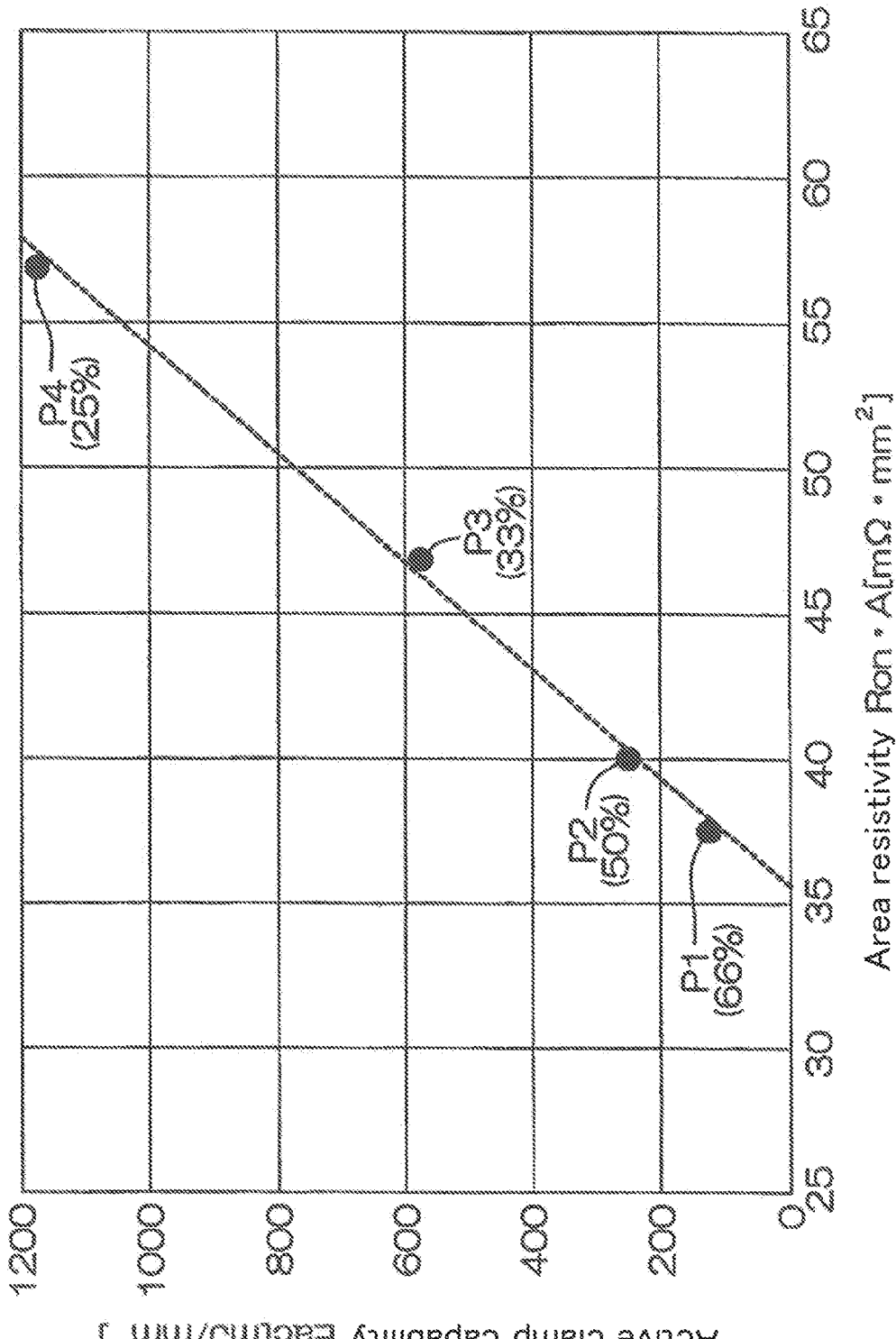
FIG. 6 is a graph showing the relationship between active clamp tolerance and area resistivity as actually observed.

FIG. 6 is a graph which is obtained by an actual measurement of a relationship between the active clamp capability (active clamp tolerance) Eac and an area resistivity Ron·A. The graph of FIG. 6 shows the characteristics where the first MISFET 56 and the second MISFET 57 are simultaneously controlled to be in the ON states and to be in the OFF states.

In FIG. 6, the vertical axis indicates the active clamp capability Eac [mJ/mm$^2$], while the horizontal axis indicates the area resistivity Ron·A [mΩ·mm$^2$]. As has been described in FIG. 3, the active clamp capability Eac is the capability with respect to the counter electromotive force. The area resistivity Ron·A expresses the ON resistance inside the semiconductor layer 2 in the normal operation.

A first plot point P1, a second plot point P2, a third plot point P3, and a fourth plot point P4 are shown in FIG. 6. The first plot point P1, the second plot point P2, the third plot point P3, and the fourth plot point P4 show the respective characteristics where the average channel rate RAV (that is, a total channel rate RT occupied in each of the cell regions 75) is adjusted to 66%, 50%, 33%, and 25%.

In a case where the average channel rate RAV was increased, the area resistivity Ron·A in the normal operation was reduced and the active clamp capability Eac in the active clamp operation was reduced. In contrast thereto, where the average channel rate RAV was reduced, the area resistivity Ron. A in the normal operation was increased and the active clamp capability Eac in the active clamp operation was improved.

In view of the area resistivity Ron·A, the average channel rate RAV is preferably not less than 33% (more specifically, from not less than 33% to less than 100%). In view of the active clamp capability Eac, the average channel rate RAV is preferably less than 33% (more specifically, in excess of 0% and less than 33%).

The area resistivity Ron·A was reduced due to an increase in the average channel rate RAV, and this is because of an increase in current path. On the other hand, the active clamp capability Eac was reduced due to an increase in the average channel rate RAV, and this is because of a sharp temperature rise due to the counter electromotive force.

In particular, in a case where the average channel rate RAV (total channel rate RT) is relatively large, it is more likely that a local and sharp temperature rise may occur in a region between the first trench gate structure 60 and the second trench gate structure 70 which are adjacent to each other. It is considered that the active clamp capability Eac was reduced due to this type of temperature rise.

On the other hand, the area resistivity Ron. A was increased due to a reduction in the average channel rate RAV, and this is because of shrinkage of the current path. The active clamp capability Eac was improved due to a reduction in the average channel rate RAV, and this is considered to be because the average channel rate RAV (total channel rate RT) was made relatively small and a local and sharp temperature rise was suppressed.

From the results of the graph of FIG. 6, it is found that an adjustment method based on the average channel rate RAV (total channel rate RT) has a trade-off relationship and therefore there is a difficulty in realizing an excellent area resistivity Ron·A and an excellent active clamp capability Eac at the same time independently of the trade-off relationship.

On the other hand, from the results of the graph of FIG. 6, it is found that, by making the power MISFET 9 operate such as to approach the first plot point P1 (RAV=66%) in the normal operation and operate such as to approach the fourth plot point P4 (RAV=25%) in the active clamp operation, it is possible to realize an excellent area resistivity Ron·A and an excellent active clamp capability Eac at the same time. Thus, in this embodiment, the following control is performed.

Figure 7:
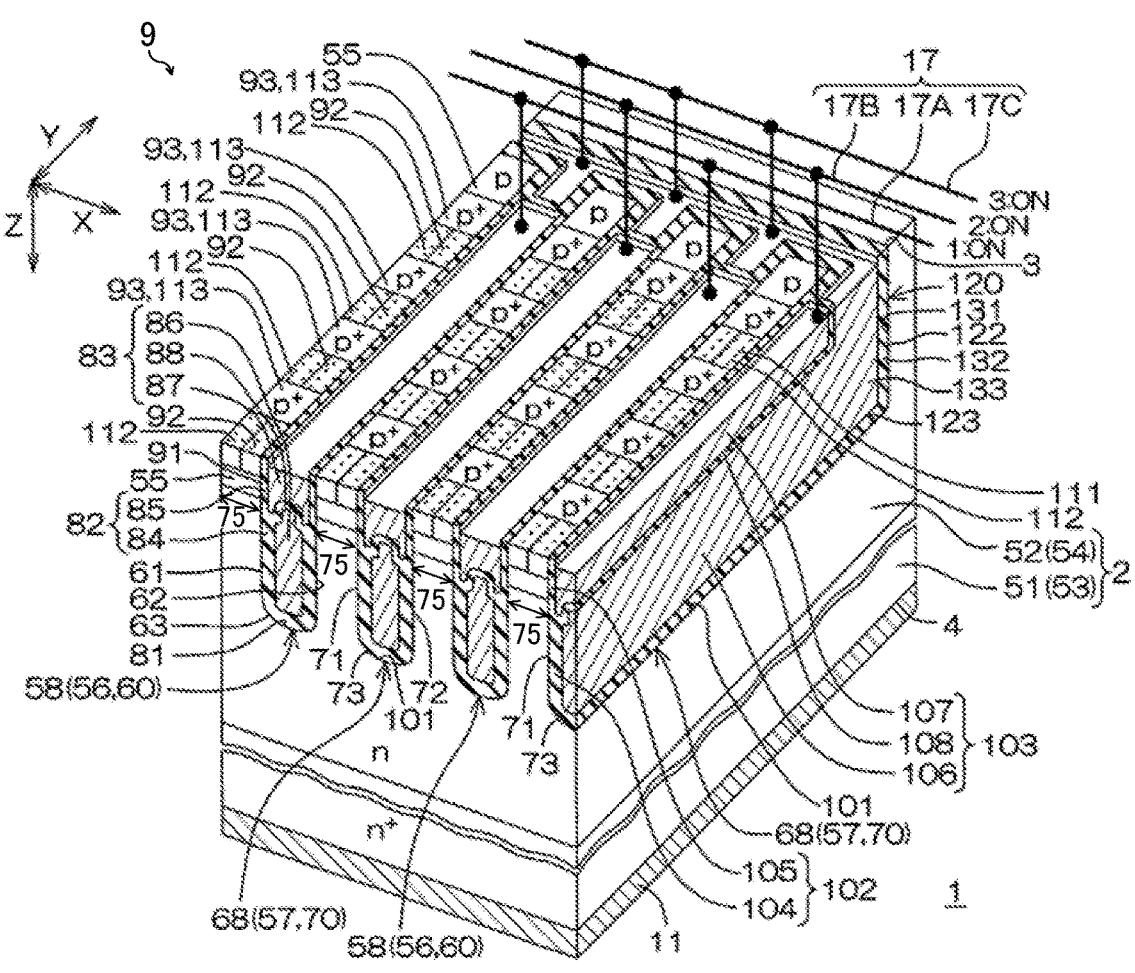
FIG. 7 is a sectional perspective view illustrating normal operation of a semiconductor device.
Figure 8:
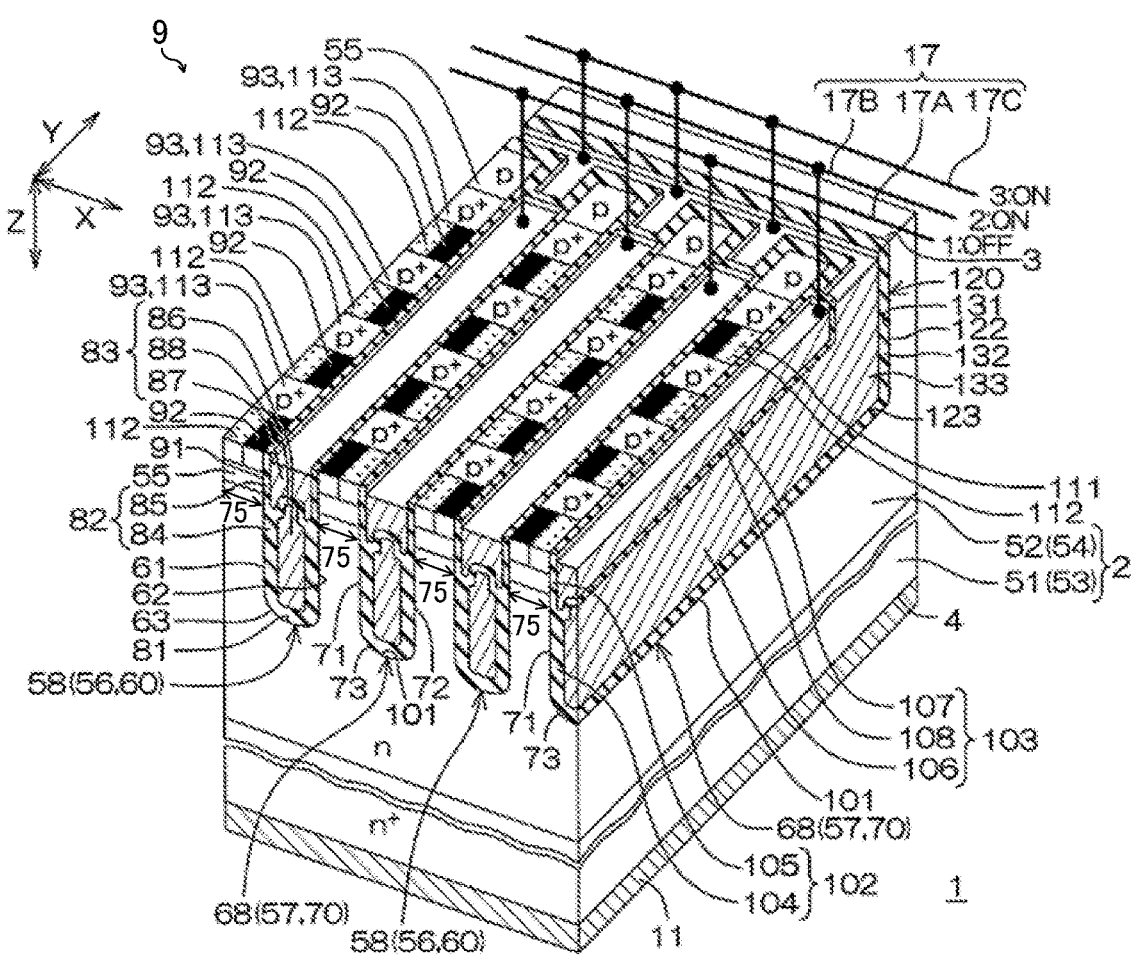
FIG. 8 is a sectional perspective view illustrating active clamp operation of a semiconductor device.

FIG. 7 is a sectional perspective view for describing the normal operation of the semiconductor device 1 shown in FIG. 1. FIG. 8 is a sectional perspective view for describing the active clamp operation of the semiconductor device 1 shown in FIG. 1. In FIG. 7 and FIG. 8, for convenience of description, structures in the first main surface 3 are omitted and the gate control wiring 17 is simplified.

With reference to FIG. 7, when the power MISFET 9 is in the normal operation, a first ON signal Von1 is input to the first gate control wiring 17A, a second ON signal Von2 is input to the second gate control wiring 17B, and a third ON signal Von3 is input to the third gate control wiring 17C. The first ON signal Von1, the second ON signal Von2, and the third ON signal Von3 are each input from the control IC 10. The first ON signal Von1, the second ON signal Von2, and the third ON signal Von3 each have a voltage equal to or higher than the gate threshold voltage Vth. The first ON signal Von1, the second ON signal Von2, and the third ON signal Von3 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 7, the first channel region 91 and the second channel region 111 in the ON states are indicated by dotted hatching.

As a result, the first MISFET 56 and the second MISFET 57 are both driven (Full-ON control). A channel utilization rate RU in the normal operation is 100%. A characteristics channel rate RC in the normal operation is 50%. The channel utilization rate RU is a rate of the first channel region 91 and the second channel region 111 which are controlled in the ON state, of the first channel region 91 and the second channel region 111.

The characteristics channel rate RC is a value obtained by multiplying the average channel rate RAV by a channel utilization rate RU ($RC=RAV \times RU$). The characteristics (the area resistivity Ron·A and the active clamp capability Eac) of the power MISFET 9 are determined based on the characteristics channel rate RC. Thereby, the area resistivity Ron. A approaches the area resistivity Ron. A indicated by the second plot point P2 in the graph of FIG. 6.

On the other hand, with reference to FIG. 8, when the power MISFET 9 is in the active clamp operation, an OFF signal Voff is input to the first gate control wiring 17A, a first clamp ON signal VCon1 is input to the second gate control wiring 17B, and a second clamp ON signal VCon2 is input to the third gate control wiring 17C.

The OFF signal Voff, the first clamp ON signal VCon1, and the second clamp ON signal VCon2 are each input from the control IC 10. The OFF signal Voff has a voltage less than the gate threshold voltage Vth (for example, the reference voltage). The first clamp ON signal VCon1 and the second clamp ON signal VCon2 each have a voltage equal to or higher than the gate threshold voltage Vth. The first clamp ON signal VCon1 and the second clamp ON signal VCon2 may each have an equal voltage. The first clamp ON signal VCon1 and the second clamp ON signal VCon2 may have a voltage not more than or less than a voltage in the normal operation.

In this case, the first opening-side electrode 87 is put into the OFF state, and the first bottom-side electrode 86, the second bottom-side electrode 106, and the second opening-side electrode 107 are each put into the ON state. Thereby, the first channel region 91 is controlled to be in the OFF state, and the second channel region 111 is controlled to be in the ON state. In FIG. 8, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 6.

In this case, the control IC 10 controls the first MISFET 56 and the second MISFET 57 such that a different characteristics channel rate RC (area of channel) can be applied between the normal operation or the active clamp operation. More specifically, the control IC 10 controls the first MISFET 56 and the second MISFET 57 such that the channel utilization rate RU in the active clamp operation becomes in excess of zero and less than the channel utilization rate RU in the normal operation.

More specifically, in the normal operation, the control IC 10 keeps the first and second MISFETs 56 and 57 on and, in the active clamp operation, the control IC 10 keeps the first MISFET 56 off and the second MISFET 57 on.

Therefore, the characteristics channel rate RC relatively increases in the normal operation. That is, in the normal operation, a current can be passed by use of the first and second MISFETs 56 and 57. Thereby, a current path is relatively increased, and it becomes possible to reduce the area resistivity Ron·A (ON resistance).

On the other hand, the characteristics channel rate RC relatively reduces in the active clamp operation. That is, a current can be passed by use of the second MISFET 57 with the first MISFET 56 stopped, and thus the counter electromotive force can be consumed (absorbed) in the second MISFET 57. Thereby, it is possible to suppress a sharp temperature rise due to the counter electromotive force and therefore it is possible to improve the active clamp capability Eac.

In this way, it is possible to provide the semiconductor device 1 capable of realizing both of an excellent area resistivity Ron·A and an excellent active clamp capability Eac, independently of the trade-off relationship shown in FIG. 6.

In the example of operation described above, second Half-ON control is applied in the active clamp operation. Instead, first Half-ON control may be applied in the active clamp operation.

First Embodiment

Figure 9:
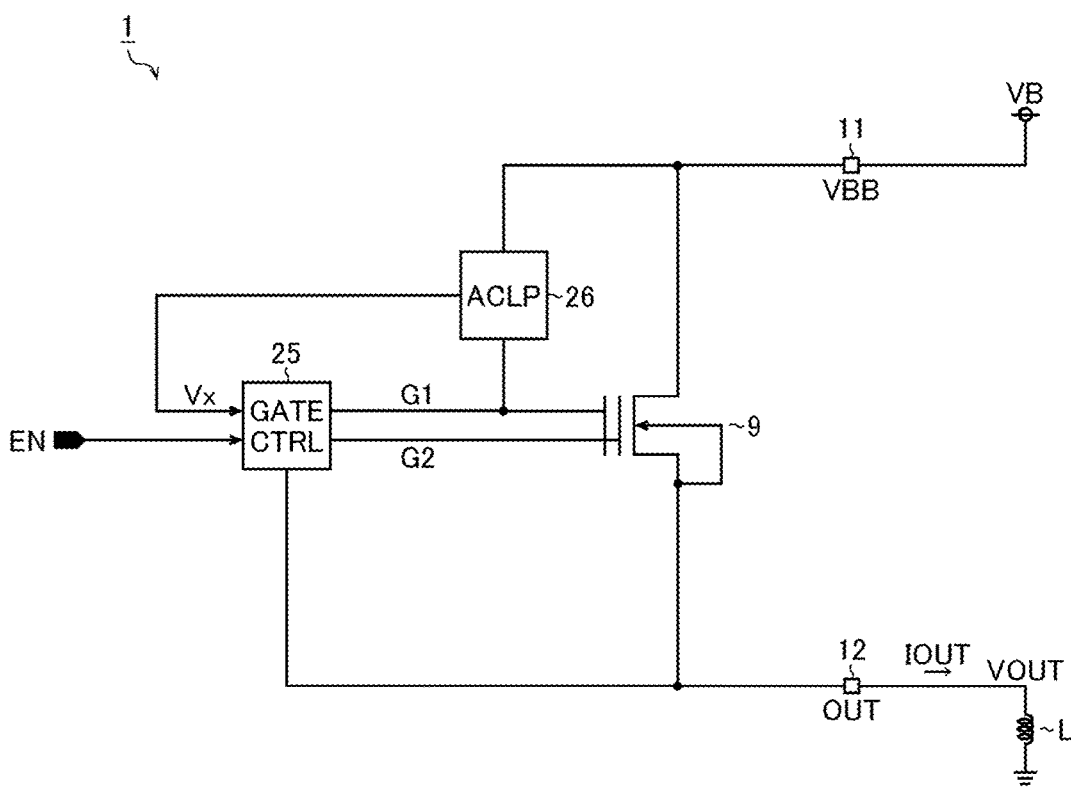
FIG. 9 is a block circuit diagram of a semiconductor device according to a first embodiment.

FIG. 9 is a block circuit diagram of a semiconductor device according to a first embodiment (i.e., an electrical structure for performing, in a case where the semiconductor device 1 is a high-side switch IC, first Half-ON control of a power MISFET during active clamp operation.

The semiconductor device 1 of this embodiment includes a drain electrode 11 (i.e., a power electrode VBB), a source electrode 12 (i.e., an output electrode OUT), a power MISFET 9, a gate control circuit 25, and an active clamp circuit 26. The components described previously will continue to be identified by the same reference signs.

For the sake of simple description, the diagram only shows relevant components; basically, the semiconductor device 1 can be understood to include components similar to those in the semiconductor device 1 described previously (see FIG. 2).

Figure 10:
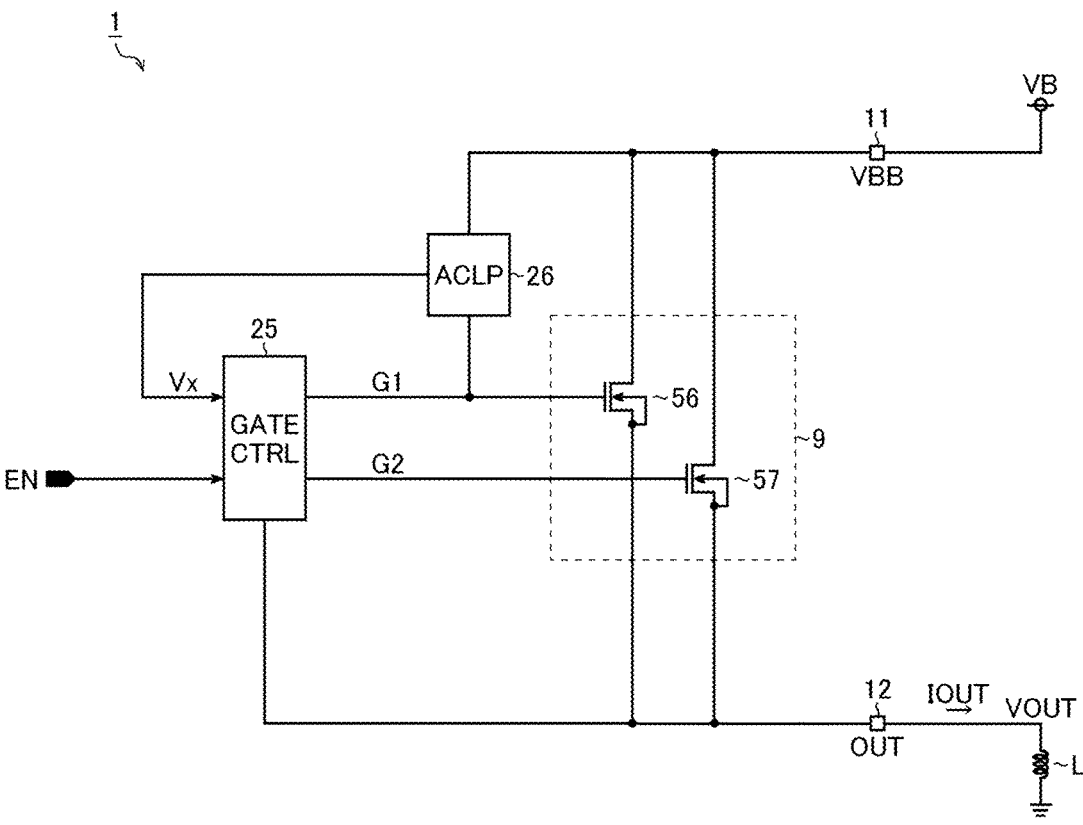
FIG. 10 is an equivalent circuit diagram in which the power MISFET in FIG. 9 is represented as a first MISFET and a second MISFET.

The power MISFET 9 is a split-gate device of which the structure has been described in detail thus far by way of various embodiments. That is, as shown in FIG. 10, the power MISFET 9 can be represented equivalently as a first MISFET 56 and a second MISFET 57 (corresponding to a first transistor and a second transistor respectively) connected in parallel.

From another angle, it can be understood that a first MISFET 56 and a second MISFET 57 that are controlled individually are formed integrally as a single split-gate device acting as a power MISFET 9.

The gate control circuit 25 controls the gate of the power MISFET 9 (hence the gate of each of the first and second MISFETs 56 and 57). For example, the gate control circuit 25 generates gate control signals G1 and G2 for the first and second MISFETs 56 and 57 respectively so as to keep the first and second MISFETs 56 and 57 both on in an enabled state (corresponding to a first operating state) in which an enable signal EN is at high level and to keep the first and second MISFETs 56 and 57 both off in a disabled state (corresponding to a second operating state) in which the enable signal EN is at low level.

Here, the enable signal EN is at high level when an external control signal IN fed to the input electrode 13 is at high level (the logic level requesting the power MISFET 9 to be on) and is at low level when the external control signal IN is at low level (the logic level requesting the power MISFET 9 to be off).

The gate control circuit 25 receives an internal node voltage Vx from the active clamp circuit 26, and has a function of, after a transition from the enabled state (EN=H) to the disabled state (EN=L), before the active clamp circuit 26 operates (i.e., before an output voltage VOUT) is clamped), short-circuiting between the gate and the source of the second MISFET 57, that is, making G2=VOUT to completely stop the second MISFET 57 and thereby achieving first Half-ON control of the power MISFET 9.

The active clamp circuit 26 is connected between the drain and the gate of the first MISFET 56. When, after the external control signal IN (hence the enable signal EN) turns the low level, the output voltage VOUT at the source electrode 12 becomes a negative voltage, the active clamp circuit 26 forcibly turns on the first MISFET 56 (without turning it fully on) and thereby limits the drain-source voltages (=VB−VOUT) of each of the first and second MISFETs 56 and 57 to or below a predetermined clamp voltage Vclp.

The second MISFET 57 does not contribute to active clamp operation and accordingly no active clamp circuit 26 is connected between its drain and gate.

Figure 11:
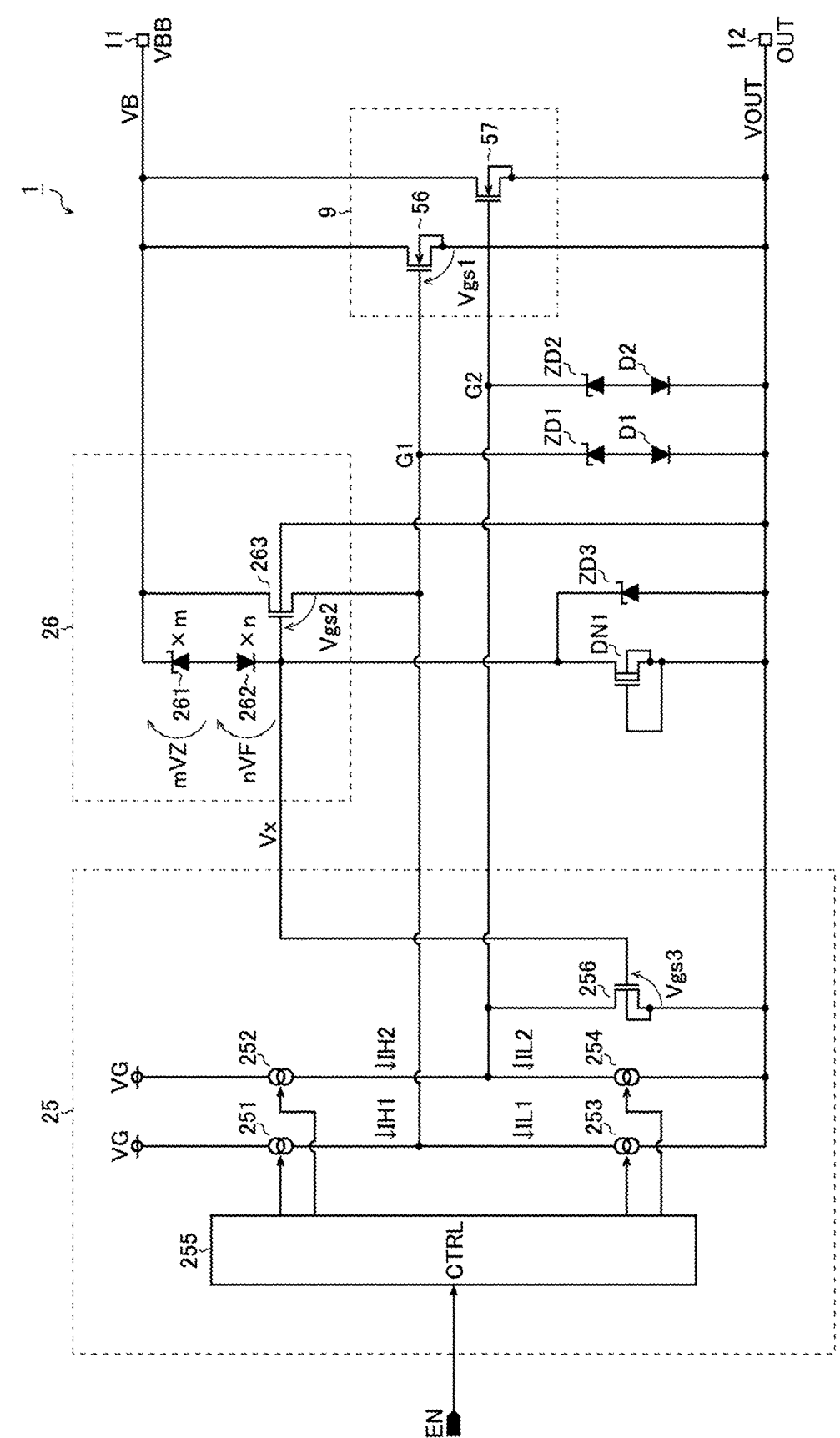
FIG. 11 is a circuit diagram showing one configuration example of the gate control circuit and the active clamp circuit in FIG. 10.

FIG. 11 is a circuit diagram showing one configuration example of the gate control circuit 25 and the active clamp circuit 26 in FIG. 9.

First, the configuration of the active clamp circuit 26 will be described specifically. The active clamp circuit 26 of this configuration example includes an m-stage Zener diode array 261 (e.g., m=8), an n-stage diode array 262 (e.g., m=3), and an N-channel MISFET 263 (corresponding to a third transistor).

The cathode of the Zener diode array 261 and the drain of the MISFET 263 are, along with the drains of the first and second MISFETs 56 and 57, connected to the drain electrode

11 (corresponding to the power electrode VBB to which the supply voltage VB is applied). The anode of the Zener diode array 261 is connected to the anode of the diode array 262. The cathode of the diode array 262 is connected to the gate of the MISFET 263. The source of the MISFET 263 is connected to the gate of the first MISFET 56 (i.e., an application terminal for the gate control signal G1). The back gate of the MISFET 263 is, along with the sources of the first and second MISFETs 56 and 57, connected to the source electrode 12 (corresponding to the output electrode OUT to which the output voltage VOUT is applied). As shown in FIGS. 9 and 10 referred to previously, to the source electrode 12 can be connected an inductive load L such as a coil or solenoid.

Next, the configuration of the gate control circuit 25 will be described specifically. The gate control circuit 25 of this configuration example includes current sources 251 to 254, a controller 255, and an N-channel MISFET 256 (corresponding to a fourth transistor).

The current source 251 is connected between an application terminal for a boosted voltage VG (i.e., the output of a charge pump) and the gate of the first MISFET 56, and generates a source current IH1.

The current source 252 is connected between the application terminal for the boosted voltage VG and the gate of the second MISFET 57, and generates a source current IH2.

The current source 253 is connected between the gate of the first MISFET 56 and an application terminal for the output voltage VOUT (i.e., the source electrode 12), and generates a sink current IL1.

The current source 254 is connected between the gate of the second MISFET 57 and the application terminal for the output voltage VOUT, and generates a sink current IL2.

In the enabled state (EN=H), the controller 255 keeps the current sources 251 and 252 on and the current sources 253 and 254 off. Through this current control, the source currents IH1 and IH2 are fed into the gates of the first and second MISFETs 56 and 57 respectively.

By contrast, in the disabled state (EN=L), the controller 255 keeps the current sources 251 and 252 off and the current sources 253 and 254 on. Through this current control, the sink currents IL1 and IL2 are drawn out of the gates of the first and second MISFETs 56 and 57 respectively.

The MISFET 256 is connected between the gate and the source of the second MISFET 57, and is turned on and off according to the internal node voltage Vx in the active clamp circuit 26. Here, it is preferable to feed as the internal node voltage Vx, for example, the gate voltage of the MISFET 263. This however is not meant as any limitation: it is also possible to use as the internal node voltage Vx, for example, the anode voltage of any of the n-stage diodes constituting the diode array 262.

The semiconductor device 1 includes, in addition to the components mentioned above, Zener diodes ZD1 to ZD3, diodes D1 and D2, and a transistor DN1 (e.g., depression N-channel MISFET) as electrostatic breakdown prevention elements. The interconnections among these will now be described in brief.

The cathodes of the Zener diodes ZD1 an ZD2 are connected to the gates of the first and second MISFETs 56 and 57 respectively. The anodes of the Zener diodes ZD1 an ZD2 are connected to the anodes of the diodes D1 and D2 respectively. The cathode of the Zener diode ZD3 and the drain of the transistor DN1 are both connected to the gate of the MISFET 263. The cathodes of the diodes D1 and D2, the anode of the Zener diode ZD3, and the source, the gate, and the back gate of the transistor DN1 are connected to the application terminal for the output voltage VOUT.

Now, first Half-ON control of the power MISFET 9 during active clamp operation will be described on the following assumptions: the gate-source voltage of the first MISFET 56 is Vgs1; the gate-source voltage of the MISFET 263 is Vgs2; the gate-source voltage of the MISFET 256 is Vgs3; the breakdown voltage of the Zener diode array 261 is mVZ; and the forward drop voltage of the diode array 262 is nVF.

Figure 12:
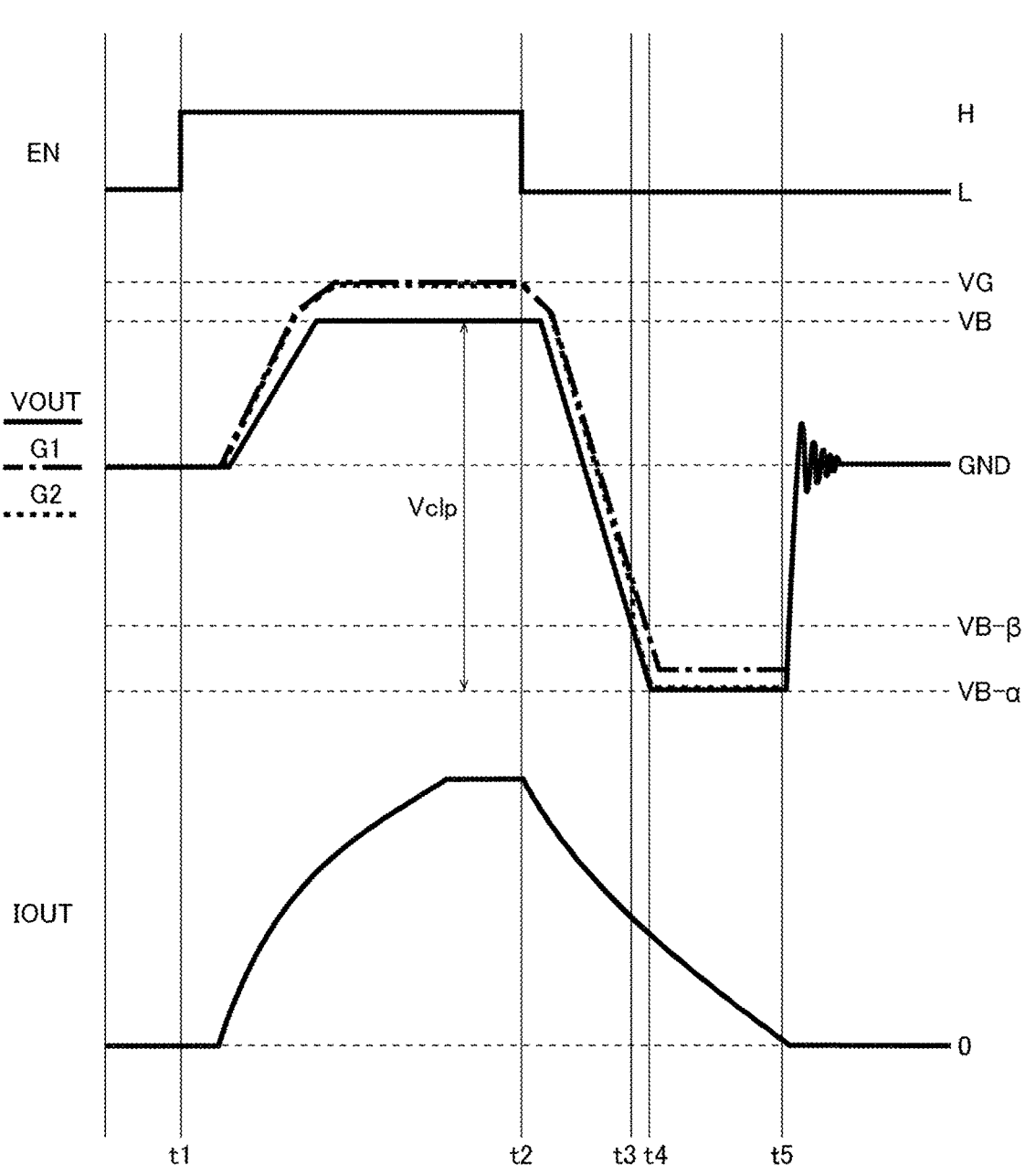
FIG. 12 is a timing chart showing how first Half-ON control of a power MISFET proceeds during active clamp operation.

FIG. 12 is a timing chart showing how first Half-ON control of the power MISFET 9 proceeds during active clamp operation in the semiconductor device 1, depicting, from top down, the enable signal EN, the output voltage VOUT (solid line), the gate control signals G1 (dash-and-dot line) and G2 (broken line), and an output current IOUT. The diagram assumes that an inductive load L is connected between the source electrode 12 (output electrode OUT) and a ground terminal.

When at time t1 the enable signal EN is raised to high level (the logic level requesting the power MISFET 9 to be on), the gate control signals G1 and G2 turn to high level (≈VG) and the first and second MISFETs 56 and 57 turn on. As a result, the output current IOUT starts to pass and accordingly the output voltage VOUT rises to close to the supply voltage VB. This state corresponds to a Full-ON state of the power MISFET 9.

After that, when at time t2 the enable signal EN is dropped to low level (the logic level requesting the power MISFET 9 to be off), the first and second MISFETs 56 and 57 turn off and thus the gate control signals G1 and G2 fall to low level (≈VOUT).

Now the inductive load L keeps the output current IOUT passing until it has discharged the energy it stored in the on period of the power MISFET 9. As a result, the output voltage VOUT falls sharply to a negative voltage lower than the ground voltage GND.

Meanwhile, when at time t4 the output voltage VOUT falls to a lower-limit voltage VB−α (e.g., VB−50V) lower than the supply voltage VB by a predetermined value α (=mVZ+nVF+Vgs1+Vgs2), the active clamp circuit 26 operates so as to turn the first MISFET 56 on (without turning it fully off), and thus the output current IOUT is discharged via the first MISFET 56. Accordingly, the output voltage VOUT is limited to or above the lower-limit voltage VB−α.

That is, the active clamp circuit 26, by limiting the output voltage VOUT relative to the supply voltage VB, limits the drain-source voltage Vds (=VB−VOUT) of the power MISFET 9 to or below a predetermined clamp voltage Vclp (=α). This active clamp operation is continued until the energy stored in the inductive load L has been discharged completely and the output current IOUT ceases to pass.

On the other hand, with attention paid to the second MISFET 57, after a transition from the enabled state (EN=H) to the disabled state (EN=L), when at time t3 the output voltage VOUT falls down to a channel switch voltage VB−β (>VB−α) that is lower than the supply voltage VB by a predetermined value β (=mVZ+nVF+Vgs3), the internal node voltage Vx becomes higher than the gate-source voltage Vgs3; thus the MISFET 256 turns on and the gate and the source of the second MISFET 57 are short-circuited together (G2=VOUT).

That is, the MISFET 256 operates so as to fully stop the second MISFET 57 before the active clamp circuit 26 operates (before time t4). This state corresponds to a first Half-ON state of the power MISFET 9.

In this way, a switch from the Full-ON state to the first Half-ON state makes the channel utilization rate RU during active clamp operation (i.e., between times t4 and t5) more than zero but less than the channel utilization rate RU during normal operation (i.e., between times t1 and t2).

Thus, in normal operation, the characteristics channel rate RC is relatively increased (e.g., RC=50%). This results in a relatively augmented current path, and thus helps achieve a reduced area resistivity Ron·A. By contrast, in active clamp operation, the characteristics channel rate RC is relatively reduced (e.g., RC=25%). This helps suppress a sharp rise in temperature ascribable to a counter-electromotive force in the inductive load L, and thus helps achieve an improved active clamp tolerance Eac.

It is thus possible to provide a semiconductor device 1 with an excellent area resistivity Ron·A combined with an excellent active clamp tolerance Eac regardless of the trade-off relationship shown in FIG. 6. In the field of IPDs in particular, active clamp tolerance Eac is one of the characteristics important in driving heavier inductive loads L.

FIGS. 9 to 12 deal with examples where first Half-ON control is applied during active clamp operation. Instead, second Half-ON control can be applied during active clamp operation. The operation in that case can be understood with the first and second MISFETs 56 and 57 interchanged.

<Study on Active Clamp Operation in an Output Shorted State>

As described thus far, semiconductor devices 1 offered as IPDs on the market include an active clamp circuit 26 as a means for absorbing a counter-electromotive force in an inductive load L. Semiconductor devices 1 have an active clamp tolerance Eac set model by model, and in cases where a load exceeding the active clamp tolerance Eac is connected to them, the semiconductor devices 1 need to be protected with components externally connected to them.

As described previously, a satisfactory combination of an area resistivity Ron·A (on resistance) and an active clamp tolerance Eac as main characteristics of an IPD is achieved by use of a power MISFET 9 of a split-gate type. More specifically, first Half-ON control (or second Half-ON control) is applied to the power MISFET 9 to achieve a reduced area resistivity Ron·A (on resistance) during normal operation combined with an improved active clamp tolerance Eac during active clamp operation.

Here, so long as no output short is present at the source electrode 12 (output electrode OUT), applying first Half-ON control (or second Half-ON control) as described above does not pose a notable problem. However, in a state where the source electrode 12 is ground-shorted via a wire harness (i.e., the output is shorted to a ground terminal or a low-potential terminal comparable to it), first Half-ON control (or second Half-ON control) can pose a problem. Note that a wire harness generally has an inductance component.

Figure 13:
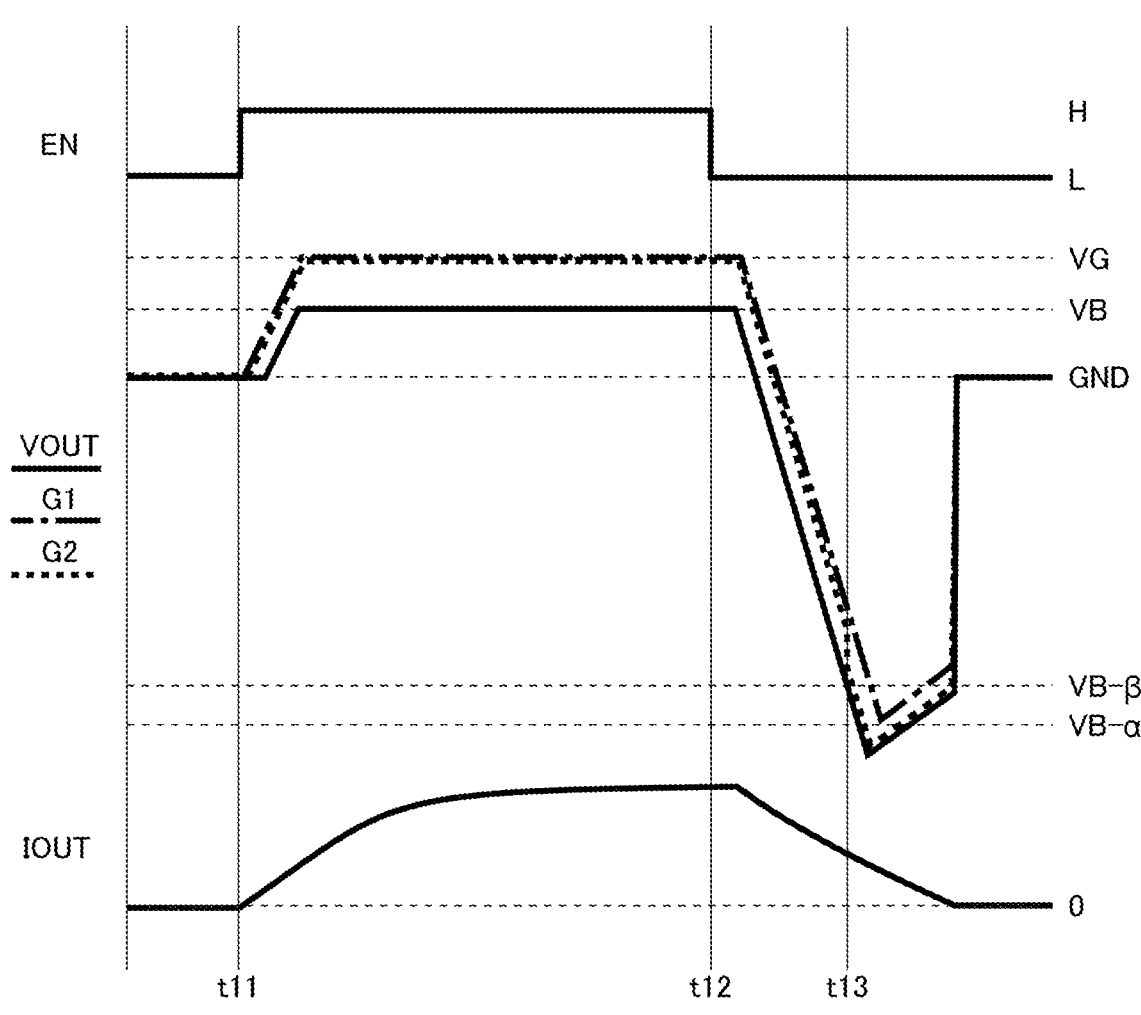
FIG. 13 is a diagram illustrating active clamp operation in an output shorted state in the semiconductor device according to the first embodiment.

FIG. 13 is a diagram illustrating active clamp operation in an output shorted state in the semiconductor device 1 of the first embodiment, depicting, from top down, the enable signal EN, the output voltage VOUT (solid line), the gate control signals G1 (dash-dot line) and G2 (broken line), and the output current IOUT.

Times t11 to t13 in the diagram correspond to times t1 to t3 in FIG. 12. That is, in the diagram, after a transition at time t12 from the enabled state (EN=H) to the disabled state (EN=L), when at time t13 the output voltage VOUT falls down to the channel switch voltage VB−β (>VB−α), the power MISFET 9 is switched to the first Half-ON state.

If at that time an output short is present at the source electrode 12 (output electrode OUT), a high current passes instantaneously in a state where the power MISFET 9 has a raised on resistance (a state where the power MISFET 9 has a reduced current capacity), and after that the output voltage VOUT is clamped. This is the strictest condition for active clamp operation, causing a drawback in the form of a drop in the active clamp tolerance Eac.

What is observed is as follows. As shown in the diagram, an output current IOUT exceeding the clamping capacity of the active clamp circuit 26 passes, and this causes an overshoot in the output voltage VOUT (i.e., a peak with a negative polarity falling below the lower-limit voltage VBB–α).

In view of the study above, a second embodiment will now be presented that can optimize active clamp operation in an output shorted state.

Second Embodiment

Figure 14:
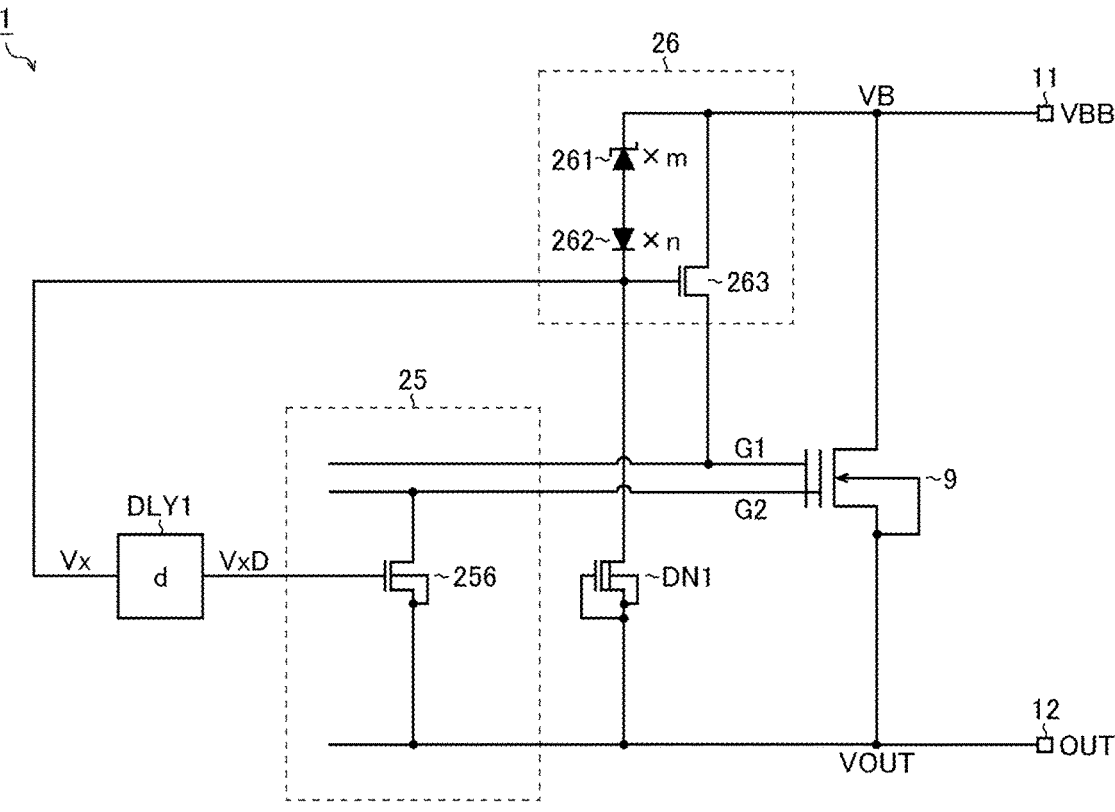
FIG. 14 is a block circuit diagram of a semiconductor device according to a second embodiment.

FIG. 14 is a block circuit diagram of a semiconductor device 1 according to a second embodiment. The semiconductor device 1 of the second embodiment is based on the first embodiment described previously (FIG. 11) and further includes a delay circuit DLY1.

The power MISFET 9 is of a split-gate type as described above, and has a clamp gate (i.e., an application terminal for the gate control signal G1) to which the active clamp circuit 26 is connected and a non-clamp gate (i.e., an application terminal for the gate control signal G2) to which the active clamp circuit 26 is not connected.

The delay circuit DLY1 gives a predetermined delay to the internal node voltage Vx in the active clamp circuit 26 (in the diagram, the gate voltage of the MISFET 263) to generate a delayed internal node voltage VxD (corresponding to a delayed internal signal). The internal node voltage Vx corresponds to an internal signal that indicates whether the drain-source voltage Vds (=VB–VOUT) of the power MISFET 9 is higher than a predetermined threshold value (=β) lower than the clamp voltage Vclp (=α).

The gate control circuit 25 controls the gate control signals G1 and G2 individually so as to raise the on resistance of the power MISFET 9 according to the delayed internal node voltage VxD. In terms of what is shown in the diagram, the gate control circuit 25 includes a MISFET 256 connected between the non-clamp gate of the power MIS-FET 9 and the source electrode 12 (output electrode OUT), and turns the MISFET 256 on and off according to the delayed internal node voltage VxD to enable and disable the non-clamp gate of the power MISFET 9. That is, as opposed to the first embodiment (FIG. 11) described previously, the gate of the MISFET 256 is fed with, instead of the internal node voltage Vx, the delayed internal node voltage VxD.

Figure 15:
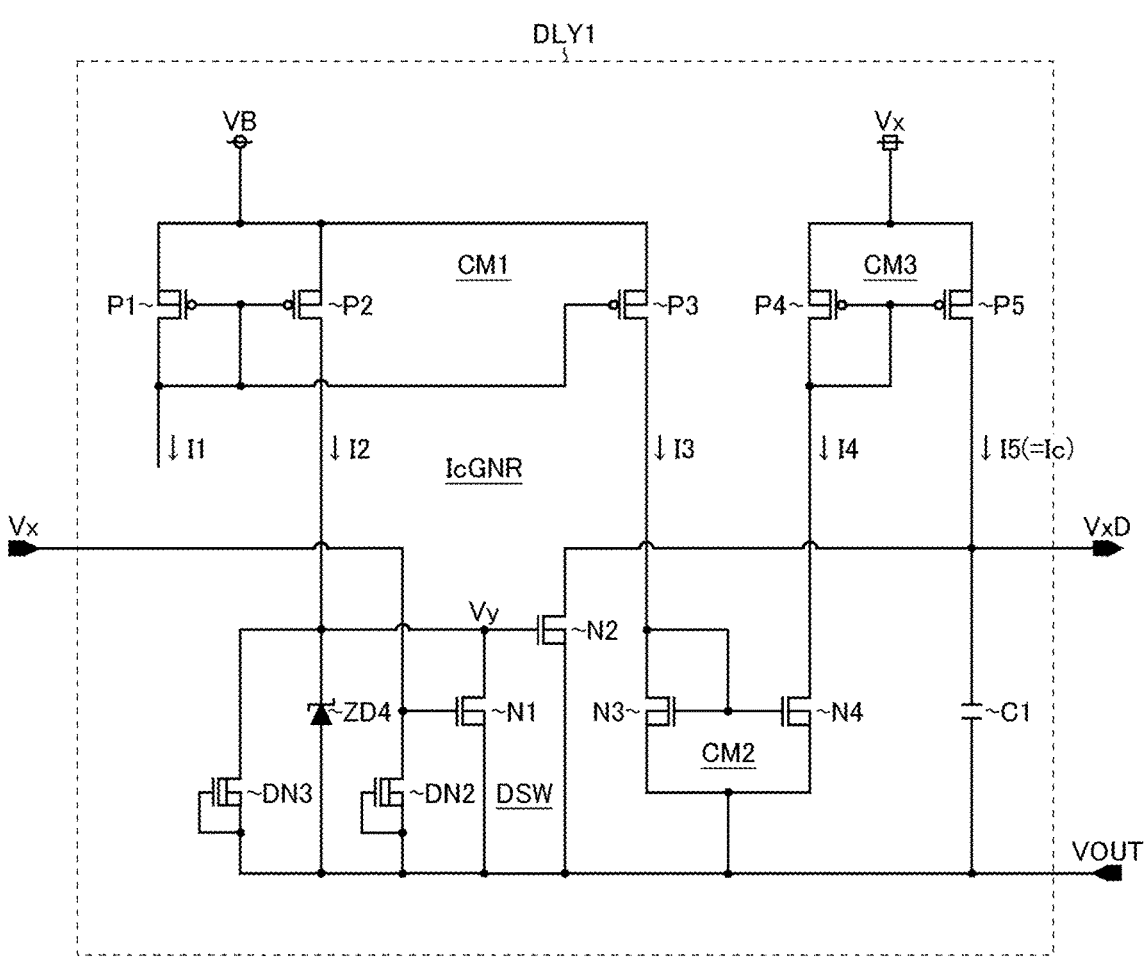
FIG. 15 is a diagram showing one configuration example of a delay circuit according to second embodiment.

FIG. 15 is a diagram showing one configuration example of the delay circuit DLY1. The delay circuit DLY1 of this configuration example includes a capacitor C1 and a charge current generator IcGNR.

The capacitor C1 is charged by a charge current Ic (i.e., the mirror current I5 described later) output from the charge current generator IcGNR, and the charge voltage of the capacitor C1 is output as the delayed internal node voltage VxD.

The charge current generator IcGNR is a circuit block that generates the charge current Ic for the capacitor C1 according to the internal node voltage Vx, and includes transistors P1 to P5 (all P-channel MISFETs), transistors N1 to N4 (all N-channel MISFETs), transistors DN2 and DN2 (both depression N-channel MISFETs), and a Zener diode ZD4.

The sources of the transistors P1 to P3 are all connected to an application terminal for the supply voltage VB (i.e., the power electrode VBB). The gates of the transistors P1 to P3 are all connected to the drain of the transistor P1. So connected, the transistors P1 to P3 function as a current mirror CM1 that mirrors a reference current I1 fed to the drain of the transistor P1 to output mirror currents I2 and I3 (where I2∝IC and I3∝IC, the sign "∝" standing for "is proportional to") from the drains of the transistors P2 and P3 respectively.

The drain of the transistor P2 is connected to the drains of the transistors N1 and DN3, to the gate of the transistor N2, and to the cathode of the Zener diode ZD4. The gate of the transistor N1 and the drain of the transistor DN2 are both connected to an input terminal for the internal node voltage Vx. The drain of the transistor N2 is connected to an output terminal for the delayed internal node voltage VxD. The sources of the transistors N1 and N2, the gates and the sources of the transistors DN2 and ND3, and the anode of the Zener diode ZD4 are all connected to an application terminal for the output voltage VOUT (output electrode OUT).

The drains of the transistors N3 and N4 are both connected to the application terminal for the output voltage VOUT. The gates of the transistors N3 and N4 are both connected to the drain of the transistor N3. The drain of the transistor N3 is connected to the drain of the transistor P3. So connected, the transistors N3 and N4 function as a current mirror CM2 that mirrors the mirror current I3 fed to the drain of the transistor N3 to output a mirror current I4 (where I4∝I3) from the drain of the transistor N4.

The sources of the transistors P4 and P5 are both connected to an application terminal for the internal node voltage Vx. The gates of the transistors P4 and P5 are both connected to the drain of the transistor P4. The drain of the transistor P4 is connected to the drain of the transistor N4. So connected, the transistors P4 and P5 function as a current mirror CM3 that mirrors the mirror current I4 fed to the drain of the transistor P4 to output a mirror current I5 (where I5∝I4) from the drain of the transistor P5.

The drain of the transistor P5 and the first terminal of the capacitor C1 are both connected to the application terminal for the delayed internal node voltage VxD. The second terminal of the capacitor C1 is connected to the application terminal for the output voltage VOUT. So connected, the capacitor C1 is charged by the mirror current I5 (corresponding to the charge current Ic) output from the drain of the transistor P5, and the charge voltage of the capacitor C1 is output as the delayed internal node voltage VxD.

In the delay circuit DLY1 of this configuration example, when the internal node voltage Vx is lower than the on threshold voltage of the transistor N1, the transistor N1 is off. Accordingly, the gate voltage Vy of the transistor N2 is at high level (≈VB), and thus the transistor N2 is on. As a result, the capacitor C1 is short-circuited across it and is in a discharged state.

By contrast, when the internal node voltage Vx is higher than the on threshold voltage of the transistor N1, the transistor N1 is on. Accordingly, the gate voltage Vy of the transistor N2 is at low level (≈VOUT), and thus the transistor N2 is off. As a result, the capacitor C1 is open across it and is in a non-discharged state (charged state). In this state, the charge voltage of the capacitor C1 (i.e., the delayed internal node voltage VxD) rises gently with a predetermined time constant.

The transistors DN2 and DN3 function as gate logic holding elements for the transistors N1 and N2 respectively.

The Zener diode ZD4 functions as a gate-source protection element for the transistor N2.

As described above, the transistors N1 and N2, the transistors DN2 and DN3, and the Zener diode ZD4 constitute a discharge switch circuit DSW that switches whether to discharge the capacitor C1 according to the internal node voltage Vx.

The current mirrors CM1 to CM3 described above can be taken as a single current mirror, in which case the current mirror CM3 can be understood as an output stage for the charge current Ic. As the driving voltage for driving the current mirror CM3, it is preferable to receive the internal node voltage Vx as shown in the diagram. With this configuration, even after the charge pump circuit 39 stops operating, the delayed internal node voltage VxD can be generated with no problem.

Figure 16:
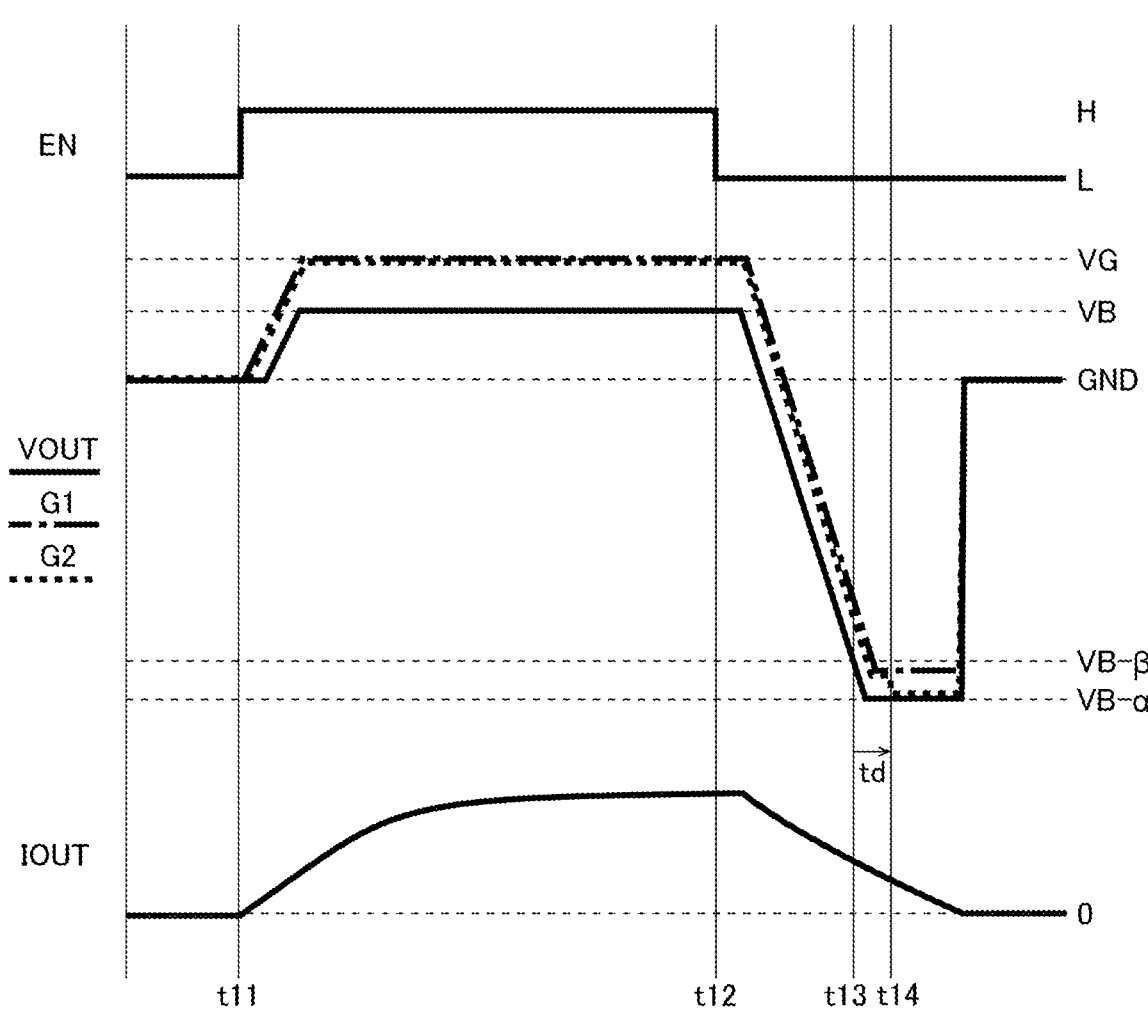
FIG. 16 is a diagram illustrating active clamp operation in the semiconductor device according to the second embodiment.

FIG. 16 is a diagram illustrating active clamp operation in the semiconductor device 1 according to the second embodiment, depicting, from top down, the enable signal EN, the output voltage VOUT (solid line), the gate control signals G1 (dash-dot line) and G2 (broken line), and the output current IOUT.

The operation before time t13 is the same as in FIG. 13 referred to previously. Accordingly, no overlapping description will be repeated and the following description focuses on the operation characteristic of the semiconductor device 1 of the second embodiment.

When at time t13 the output voltage VOUT falls down to the channel switch voltage VB–β (>VB–α), in the semiconductor device 1 of the first embodiment (FIG. 13) described previously, the power MISFET 9 is switched to the first Half-ON state without delay.

By contrast, in the semiconductor device 1 of the second embodiment, as shown in the diagram, a switch to the first Half-ON state is suspended after time t13 until a predetermined delay time td elapses at time t14. That is, as compared with the first embodiment (FIG. 13) described previously, the timing at which the non-clamp gate of the power MISFET 9 is disabled is delayed by the delay time td.

With this delay time td provided, even if as a result of, for example, the power MISFET 9 being turned off with the source electrode 12 (output electrode OUT) ground-shorted via a wire harness the output current IOUT increases instantaneously, the high current can be absorbed (clamped) before the on resistance of the power MISFET 9 is raised. It is thus possible to suppress an overshoot in the output voltage VOUT (see FIG. 13).

The energy stored in the inductance component of the wire harness is not very high. Thus the delay time td can be set to be so long as to allow absorption (clamping) of an instantaneous high current. In terms of what is shown in the diagram, the delay time td is set such that a switch to the first Half-ON state takes place promptly after the output voltage VOUT is clamped at the lower-limit voltage VB–α.

Providing the delay time td described above may cause a drawback in the form of a drop in the active clamp tolerance Eac when no output short is present at the source electrode 12 (output electrode OUT). Seeing however that the delay time td described above is sufficiently short as compared with the active clamp time TAV (e.g., several milliseconds), there is no need of concern for a drop in the active clamp tolerance Eac.

Third Embodiment

Figure 17:
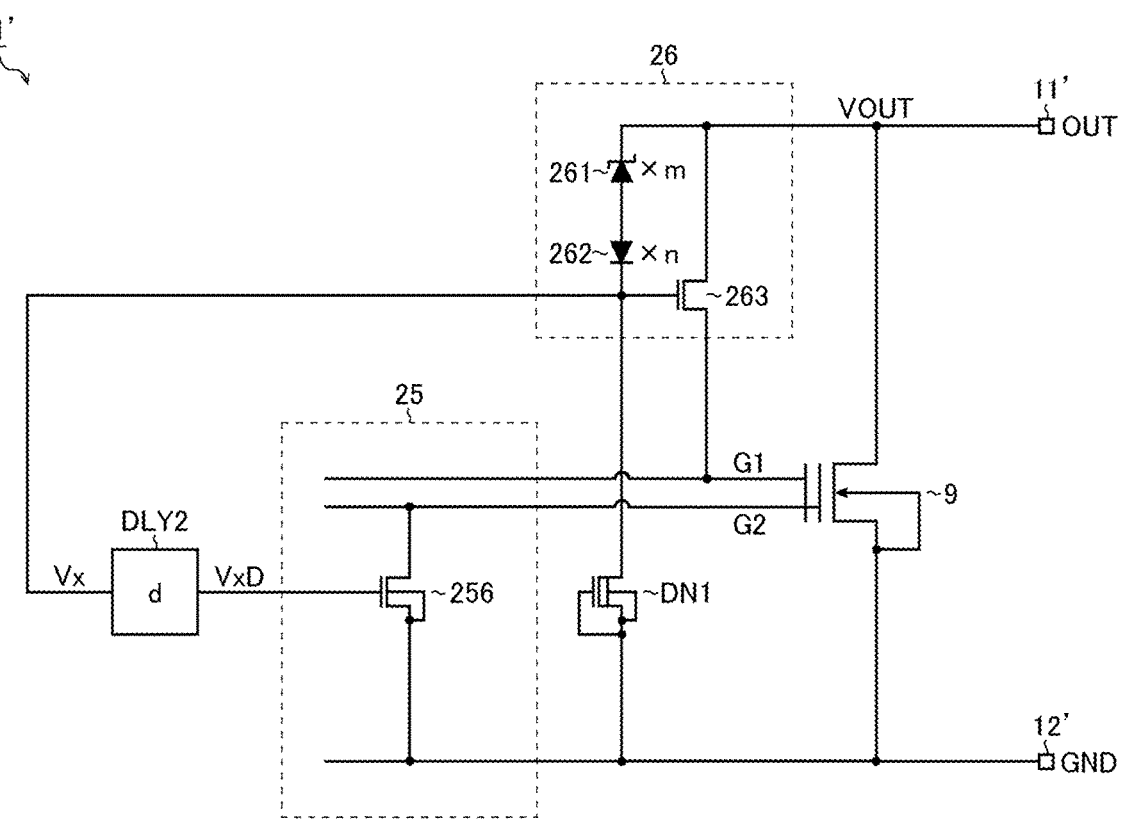
FIG. 17 is a block circuit diagram of a semiconductor device according to a third embodiment.

FIG. 17 is a block circuit diagram of a semiconductor device according to a third embodiment. The semiconductor device 1' of the third embodiment is based on the semiconductor device 1 of the second embodiment (FIG. 14) but is modified in that a high-side switch IC as the application target is replaced with a low-side switch IC.

In terms of what is shown in the diagram, the drain electrode 11 mentioned above (corresponding to the power electrode VBB) is replaced with a drain electrode 11' (corresponding to the output electrode OUT), and the source electrode 12 mentioned above (corresponding to the output electrode OUT) is replaced with a source electrode 12' (corresponding to a ground terminal GND). That is, the power MISFET 9 functions as a low-side switch that switches between a conducting state and a cut-off state a path between a load and a ground terminal.

The change of the application target from a high-side switch IC to a low-side switch IC is accompanied by replacement of the delay circuit DLY1 mentioned previously with a delay circuit DLY2.

Figure 18:
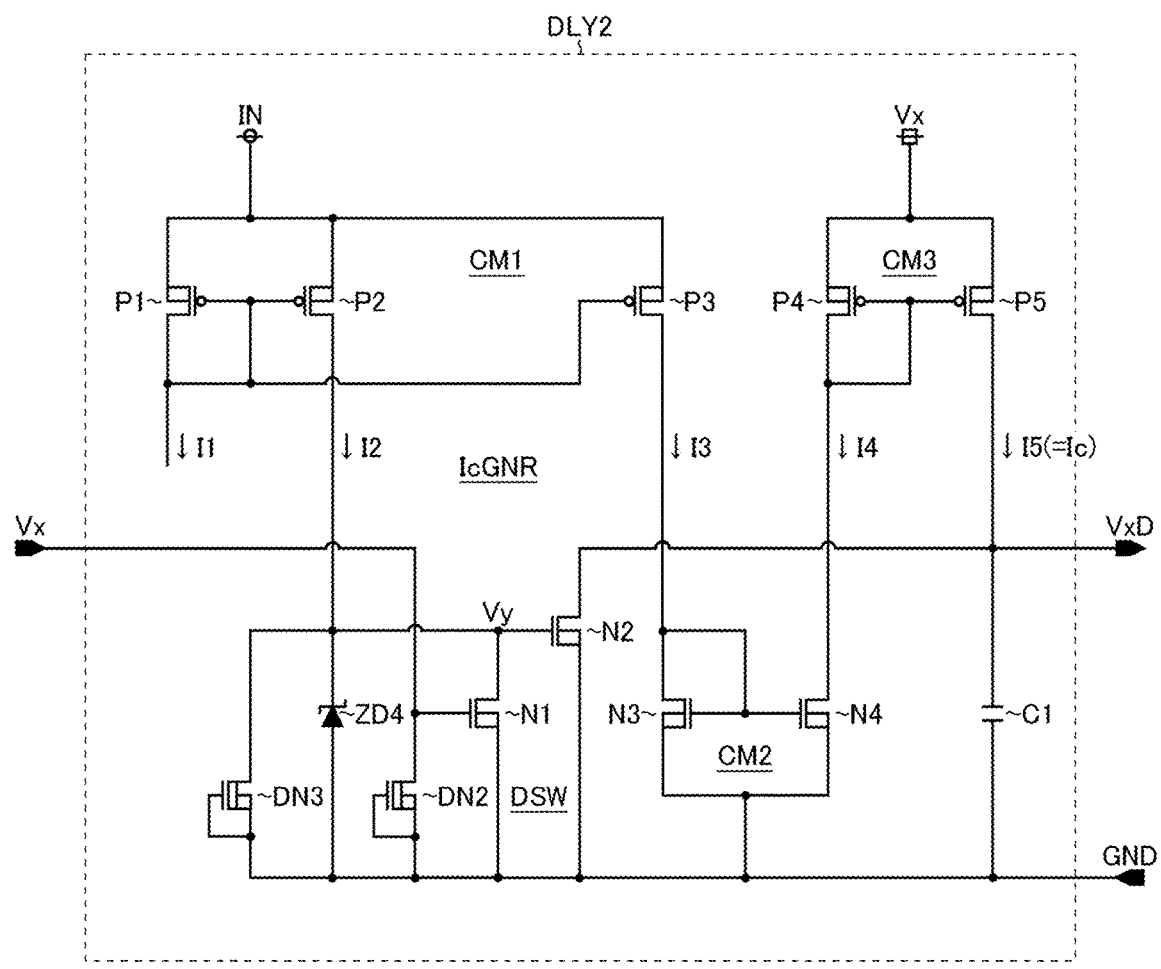
FIG. 18 is a diagram showing one configuration example of a delay circuit according to the third embodiment.

FIG. 18 is a diagram showing one configuration example of the delay circuit DLY2. The delay circuit DLY2 of this configuration example is based on what is shown in FIG. 15 but is modified in the voltages applied to different parts. In terms of what is shown in the diagram, the drains of the transistors P1 to P3 are all connected to an application terminal for the external control signal IN. That is, in the semiconductor device 1' that functions as a low-side switch IC, the external control signal IN is supplied as the driving voltage for the delay circuit DLY2.

Moreover, the drains of the transistors N1 to N4, the drains of the transistors DN3 and DN4, the anode of the Zener diode ZD4, and the second terminal of the capacitor C1 are all connected to the ground electrode GND.

Figure 19:
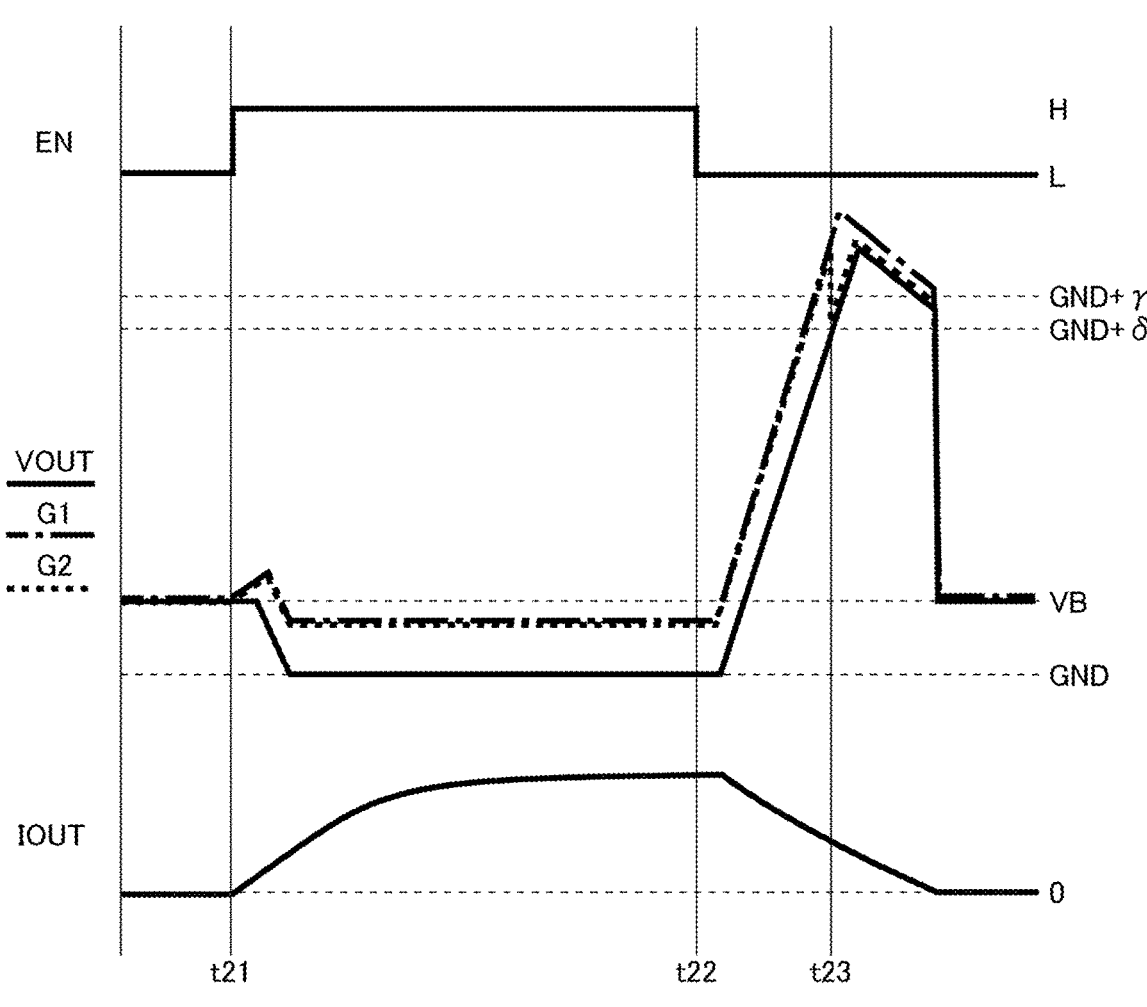
FIG. 19 is a diagram illustrating active clamp operation in the semiconductor device according to the third embodiment (with no delay circuit).
Figure 20:
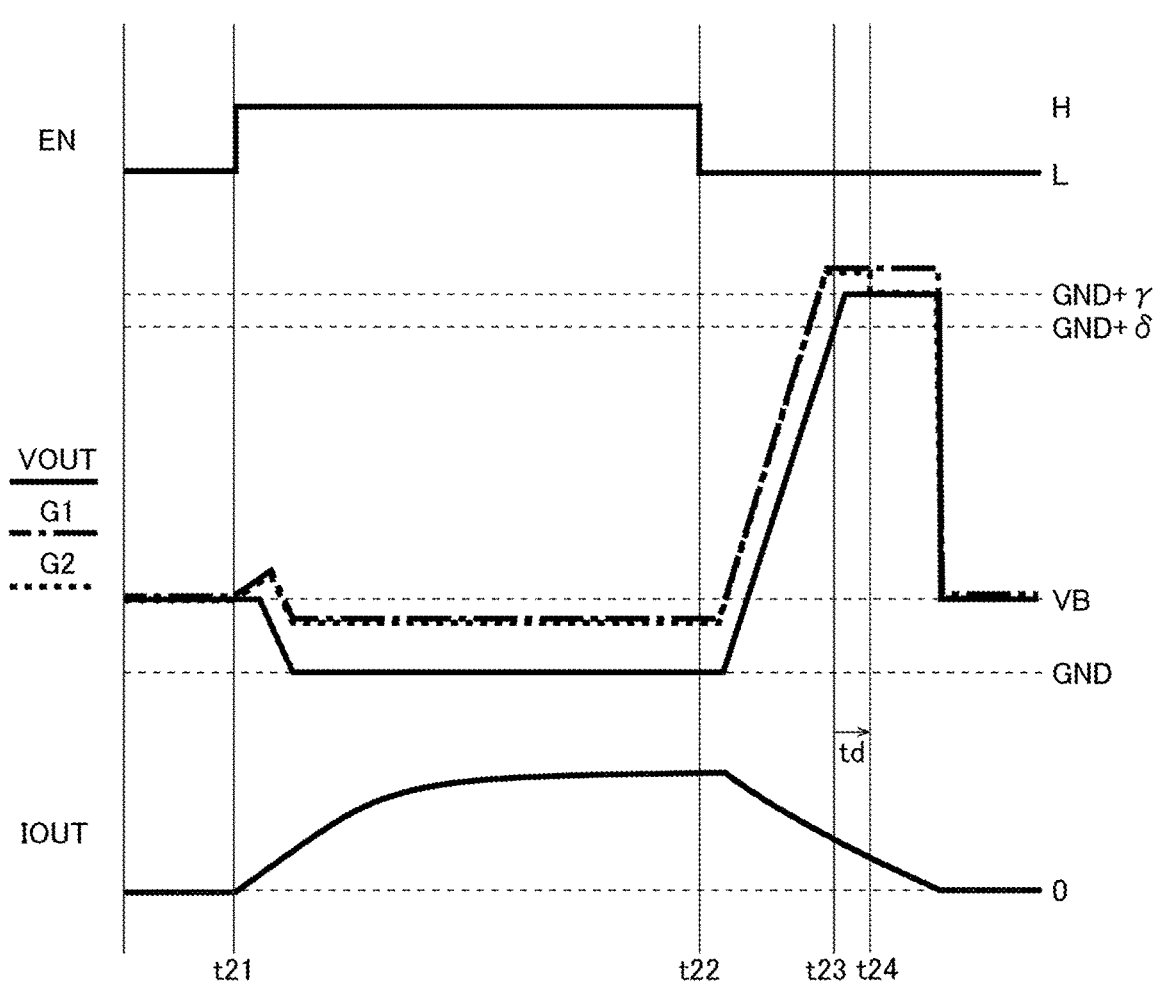
FIG. 20 is a diagram illustrating active clamp operation in the semiconductor device according to the third embodiment (with a delay circuit).

FIGS. 19 and 20 are diagrams illustrating the active clamp operation in the semiconductor device 1' of the third embodiment, depicting, from top down, the enable signal EN, the output voltage VOUT (solid line), the gate control signals G1 (dash-dot line) and G2 (broken line), and the output current IOUT. While FIG. 19 shows the behavior observed without the delay circuit DLY2, FIG. 20 shows the behavior observed with the delay circuit DLY2.

When at time t21 the enable signal EN is raised to high level (the logic level requesting the power MISFET 9 to be on), the power MISFET 9 turns on and the output current IOUT starts to pass; thus the output voltage VOUT falls to close to the ground voltage GND. This state corresponds to a Full-ON state of the power MISFET 9.

If the delay circuit DLY2 is not provided (FIG. 19), after a transition at time t22 from the enabled state (EN=H) to the disabled state (EN=L), when at time t23 the output voltage VOUT rises up to the channel switch voltage GND+γ (<GND+δ), the power MISFET 9 is turned to a first Half-ON state.

If at that time an output short is present at the drain electrode 11 (output electrode OUT), a high current passes instantaneously in a state where the power MISFET 9 has a raised on resistance (a state where the power MISFET 9 has a reduced current capacity), and after that the output voltage VOUT is clamped. This is the strictest condition for active clamp operation, causing a drawback in the form of a drop in the active clamp tolerance Eac.

What is observed is as follows. As shown in FIG. 19, an output current IOUT exceeding the clamping capacity of the active clamp circuit 26 passes, and this causes an overshoot in the output voltage VOUT (i.e., a peak with a positive polarity rising above the upper-limit voltage VBB+γ).

By contrast, if the delay circuit DLY2 is provided, as shown in FIG. 20, a switch to the first Half-ON state is suspended after time t23 until a predetermined delay time td elapses at time t24. That is, as compared with the first embodiment (FIG. 13) described previously, the timing at which the non-clamp gate of the power MISFET 9 is disabled is delayed by the delay time td.

With this delay time td provided, even if as a result of, for example, the power MISFET 9 being turned off with the drain electrode 11 (output electrode OUT) ground-shorted via a wire harness the output current IOUT increases instantaneously, the high current can be absorbed (clamped) before the on resistance of the power MISFET 9 is raised. It is thus possible to suppress an overshoot in the output voltage VOUT (see FIG. 19).

The energy stored in the inductance component of the wire harness is not very high. Thus the delay time td can be set to be so long as to allow absorption (clamping) of an instantaneous high current. In terms of what is shown in the diagram, the delay time td is set such that a switch to the first Half-ON state takes place promptly after the output voltage VOUT is clamped at the upper-limit voltage VB+δ.

Providing the delay time td described above may cause a drawback in the form of a drop in the active clamp tolerance Eac when no output short is present at the drain electrode 11 (output electrode OUT). Seeing however that the delay time td described above is sufficiently short as compared with the active clamp time TAV (e.g., several milliseconds), there is no need of concern for a drop in the active clamp tolerance Eac. In this respect, the third embodiment is similar to the second embodiment described previously.

Note that, in a switched-off period (IN=L), whether the gate control signals G1 and G2 are equal to the ground voltage GND depends on the circuit configuration. In the most basic low-side switch IC, the input electrode IN and the gate of the power MISFET 9 are connected together via a resistor and the path between the input electrode IN and the gate of the power MISFET 9 can be cut off with an analog switch. Thus, by active clamp operation, the gate control signals G1 and G2 for the power MISFET 9 can be elevated.

Adopting the above configuration, however, makes the external control signal IN in FIG. 18 zero volts and makes it impossible to control the delay circuit DLY2 (the current mirror CM1 in particular). Thus, the delay circuit DLY2 needs to operate by being supplied with the internal node voltage Vx instead of the external control signal IN. The above configuration poses no problem with a low-side switch IC that operates by being supplied with electric power from an external power supply.

<Application to a Vehicle>

Figure 21:
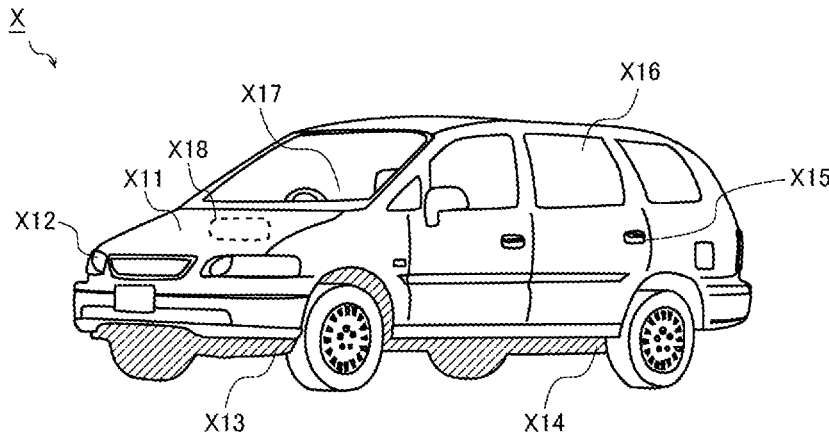
FIG. 21 is an exterior view showing one configuration example of a vehicle X.

FIG. 21 is an exterior view showing one configuration example of a vehicle X. The vehicle X of this configuration example incorporates a battery (not shown in the diagram) and various electronic devices X11 to X18 that operate by being supplied with electric power from the battery.

The vehicle X can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

For the sake of convenience, in the diagram, the electronic devices X11 to X18 may be shown at places different from where they are actually arranged.

The electronic device X11 is an engine control unit that performs control with respect to an engine (injection control, electronic throttle control, idling control, oxygen sensor heater control, automatic cruise control, etc.), or an electronic control unit that performs control with respect to a motor (torque control, electric power regeneration control, etc.).

The electronic device X12 is a lamp control unit that controls the lighting and extinguishing of HIDs (high-intensity discharged lamps), DRLs (daytime running lamps), or the like.

The electronic device X13 is a transmission control unit that performs control with respect to a transmission.

The electronic device X14 is a movement control unit that performs control with respect to the movement of the vehicle X (ABS [anti-lock brake system] control, EPS [electric power steering] control, electronic suspension control, and the like).

The electronic device X15 is a security control unit that drives and controls door locks, burglar alarms, and the like.

The electronic device X16 comprises electronic devices incorporated in the vehicle X as standard or manufacturer-fitted equipment at the stage of factory shipment, such as wipers, power side mirrors, power windows, dampers (shock absorbers), a power sun roof, and power seats.

The electronic device X17 comprises electronic devices fitted to the vehicle X optionally as user-fitted equipment, such as A/V (audio/visual) equipment, a car navigation system, and an ETC (electronic toll control system).

The electronic device X18 comprises electronic devices provided with high-withstand-voltage motors, such as a vehicle-mounted blower, an oil pump, a water pump, and a battery cooling fan.

The semiconductor device 1 described previously can be incorporated in any of the electronic devices X11 to X18.

<Overview>

To follow is an overview of the various embodiments described herein.

According to one aspect of what is disclosed herein, a semiconductor device includes: an output transistor of a split-gate type configured to have a plurality of channel regions controlled individually according to a plurality of gate control signals; an active clamp circuit configured to limit the terminal-to-terminal voltage across the output transistor to or below a predetermined clamp voltage after a control signal turns to a logic level requesting the output transistor to be off; a delay circuit configured to generate a delayed internal signal by giving a predetermined delay to an internal signal indicating whether the terminal-to-terminal voltage across the output transistor is higher than a predetermined threshold voltage lower than the clamp voltage; and a gate control circuit configured to control the plurality of gate control signals individually so as to raise the on resistance of the output transistor according to the delayed internal signal. (A first configuration.)

In the semiconductor device of the first configuration described above, the delay circuit may include: a capacitor; and a charge current generator configured to generate a charge current for the capacitor according to the internal signal. The delay circuit may output as the delayed internal signal the charge voltage across the capacitor. (A second configuration.)

In the semiconductor device of the second configuration described above, the charge current generator may include: a current mirror configured to generate the charge current according to a reference current; and a discharge switch circuit configured to switch whether to discharge the capacitor according to the internal signal. (A third configuration.)

In the semiconductor device of the third configuration described above, the current mirror may receive the internal signal as the driving voltage for driving an output stage for the charge current. (A fourth configuration.)

In the semiconductor device of any of the first to fourth configurations described above, the active clamp circuit may include: a transistor configured to be connected between the drain and the gate of the output transistor; at least one Zener diode configured to have a cathode connected to the drain of the transistor; and at least one diode configured to have an anode connected to the anode of the Zener diode and to have a cathode connected to the gate of the transistor. (A fifth configuration.)

In the semiconductor device of the fifth configuration described above, the internal signal may be an internal node voltage in the active clamp circuit. (A sixth configuration.)

In the semiconductor device of any of the first to sixth configurations described above, the output transistor may have a non-clamp gate to which the active clamp circuit is not connected, and the gate control circuit may disable the non-clamp gate according to the delayed internal signal. (A seventh configuration.)

In the semiconductor device of any of the first to seventh configurations described above, the output transistor may function as a high-side switch that switches between a conducting state and a cut-off state a path between a power terminal and a load or a low-side switch that switches between a conducting state and a cut-off state a path between the load and a ground terminal. (An eighth configuration.)

According to another aspect of what is disclosed herein, an electronic device includes: the semiconductor device of any of the first to eighth configurations described above; and a load connected to the semiconductor device. (A ninth configuration.)

According to yet another aspect of what is disclosed herein, a vehicle includes the electronic device of the ninth configuration described above. (A tenth configuration.)

According to the disclosure herein, it is possible to provide a semiconductor device capable of optimizing active clamp operation in an output shorted state, and to provide an electronic device and a vehicle that employ such a semiconductor device.

Further Modified Examples

While the above embodiments deal with, as an example, a vehicle onboard high-side switch IC and a vehicle onboard low-side switch IC, this is not meant to limit the application of the disclosure herein, which finds wide application generally in semiconductor devices that include power transistors, such as vehicle onboard IPDs (intelligent power devices, like vehicle onboard power supply IC) for any other uses.

The present disclosure can be implemented in any manner other than as in the embodiments described above, with any modifications made without departure from the spirit of its technical ingenuity. That is, the embodiments described above are to be taken to be in every aspect illustrative and not restrictive, and the technical scope of the present disclosure is defined not by the description of the embodiments given above but by the appended claims and is to be understood to encompass any modifications made within a scope equivalent in significance to what is claimed.

The invention claimed is:

1. A semiconductor device, comprising:

an output transistor of a split-gate type configured to have a plurality of channel regions controlled individually according to a plurality of gate control signals;

an active clamp circuit configured to limit a terminal-to-terminal voltage across the output transistor to or below a predetermined clamp voltage after a control signal turns to a logic level requesting the output transistor to be off;

a delay circuit configured to generate a delayed internal signal by giving a predetermined delay to an internal signal indicating whether the terminal-to-terminal voltage across the output transistor is higher than a predetermined threshold voltage lower than the clamp voltage; and a gate control circuit configured to control the plurality of gate control signals individually so as to raise an on resistance of the output transistor according to the delayed internal signal.

2. The semiconductor device according to claim 1, the delay circuit includes:

a capacitor; and a charge current generator configured to generate a charge current for the capacitor according to the internal signal, and the delay circuit outputs as the delayed internal signal a charge voltage across the capacitor.

3. The semiconductor device according to claim 2, the charge current generator includes:

a current mirror configured to generate the charge current according to a reference current; and a discharge switch circuit configured to switch whether to discharge the capacitor according to the internal signal.

4. The semiconductor device according to claim 3, the current mirror receives the internal signal as a driving voltage for driving an output stage for the charge current.

5. The semiconductor device according to claim 1, the active clamp circuit includes:

a transistor configured to be connected between a drain and a gate of the output transistor;

at least one Zener diode configured to have a cathode connected to a drain of the transistor; and at least one diode configured to have an anode connected to an anode of the Zener diode and to have a cathode connected to a gate of the transistor.

6. The semiconductor device according to claim 5, the internal signal is an internal node voltage in the active clamp circuit.

7. The semiconductor device according to claim 1, the output transistor has a non-clamp gate to which the active clamp circuit is not connected, and the gate control circuit disables the non-clamp gate according to the delayed internal signal.

8. The semiconductor device according to claim 1, the output transistor functions as a high-side switch that switches between a conducting state and a cut-off state a path between a power terminal and a load or a low-side switch that switches between a conducting state and a cut-off state a path between the load and a ground terminal.

9. An electronic device, comprising:

the semiconductor device according to claim 1; and a load connected to the semiconductor device.

10. A vehicle, comprising:

the electronic device according to claim 9.

* * * * *